United States Patent
Muraoka et al.

(10) Patent No.: US 7,525,832 B2
(45) Date of Patent: Apr. 28, 2009

(54) MEMORY DEVICE AND SEMICONDUCTOR INTEGRATED CIRCUIT

(75) Inventors: Shunsaku Muraoka, Osaka (JP); Koichi Osano, Osaka (JP); Satoru Mitani, Osaka (JP); Hiroshi Seki, Nara (JP)

(73) Assignee: Panasonic Corporation, Osaka (JP)

( * ) Notice: Subject to any disclaimer, the term of this patent is extended or adjusted under 35 U.S.C. 154(b) by 102 days.

(21) Appl. No.: 11/883,653

(22) PCT Filed: Apr. 21, 2006

(86) PCT No.: PCT/JP2006/308433
§ 371 (c)(1),
(2), (4) Date: Aug. 3, 2007

(87) PCT Pub. No.: WO2006/115208
PCT Pub. Date: Nov. 2, 2006

(65) Prior Publication Data
US 2008/0212359 A1 Sep. 4, 2008

(30) Foreign Application Priority Data
Apr. 22, 2005 (JP) ............................ 2005-125686
Oct. 24, 2005 (JP) ............................ 2005-308627

(51) Int. Cl.
*G11C 11/00* (2006.01)
(52) U.S. Cl. ................ 365/148; 365/158; 365/174; 365/175; 438/381; 438/382; 438/384; 438/385
(58) Field of Classification Search ............... 365/148, 365/158, 174, 175; 438/381, 382, 384, 385
See application file for complete search history.

(56) References Cited

U.S. PATENT DOCUMENTS 6,034,882 A 3/2000 Johnson et al.

(Continued)

FOREIGN PATENT DOCUMENTS

JP 2000-236100 8/2000

(Continued)

OTHER PUBLICATIONS

Zhuang, W. W., et al., "Novell Colossal Magnetoresistive Thin Film Nonvolatile Resistance Random Access Memory (RRAM)", IEDM, 2002, pp. 193-196, IEEE.

*Primary Examiner*—Pho M. Luu
*Assistant Examiner*—Eric Wendler
(74) *Attorney, Agent, or Firm*—McDermott Will & Emery LLP

(57) ABSTRACT

First electrode layer includes a plurality of first electrode lines (W1, W2) extending parallel to each other. State-variable layer lying on the first electrode layer includes a plurality of state-variable portions (60-11, 60-12, 60-21, 60-22) which exhibits a diode characteristic and a variable-resistance characteristic. Second electrode layer lying on the state-variable layer includes a plurality of second electrode lines (B1, B2) extending parallel to each other. The plurality of first electrode lines and the plurality of second electrode lines are crossing each other when seen in a layer-stacking direction with the state-variable layer interposed therebetween. State-variable portion (60-11) is provided at an intersection of the first electrode line (W1) and the second electrode line (B1) between the first electrode line and the second electrode line.

30 Claims, 19 Drawing Sheets

U.S. PATENT DOCUMENTS

| | | |
|---|---|---|
| 6,204,139 B1 | 3/2001 | Liu et al. |
| 6,531,371 B2 | 3/2003 | Hsu et al. |
| 6,673,691 B2 | 1/2004 | Zhuang et al. |
| 7,167,387 B2 * | 1/2007 | Sugita et al. ............... 365/148 |
| 2006/0050549 A1 * | 3/2006 | Adachi et al. ............... 365/148 |
| 2008/0025069 A1 * | 1/2008 | Scheuerlein et al. ........ 365/148 |

FOREIGN PATENT DOCUMENTS

| | | |
|---|---|---|
| JP | 2002-530850 | 9/2002 |
| JP | 2005-347468 | 12/2005 |

* cited by examiner

FIG. 21 —PRIOR ART—
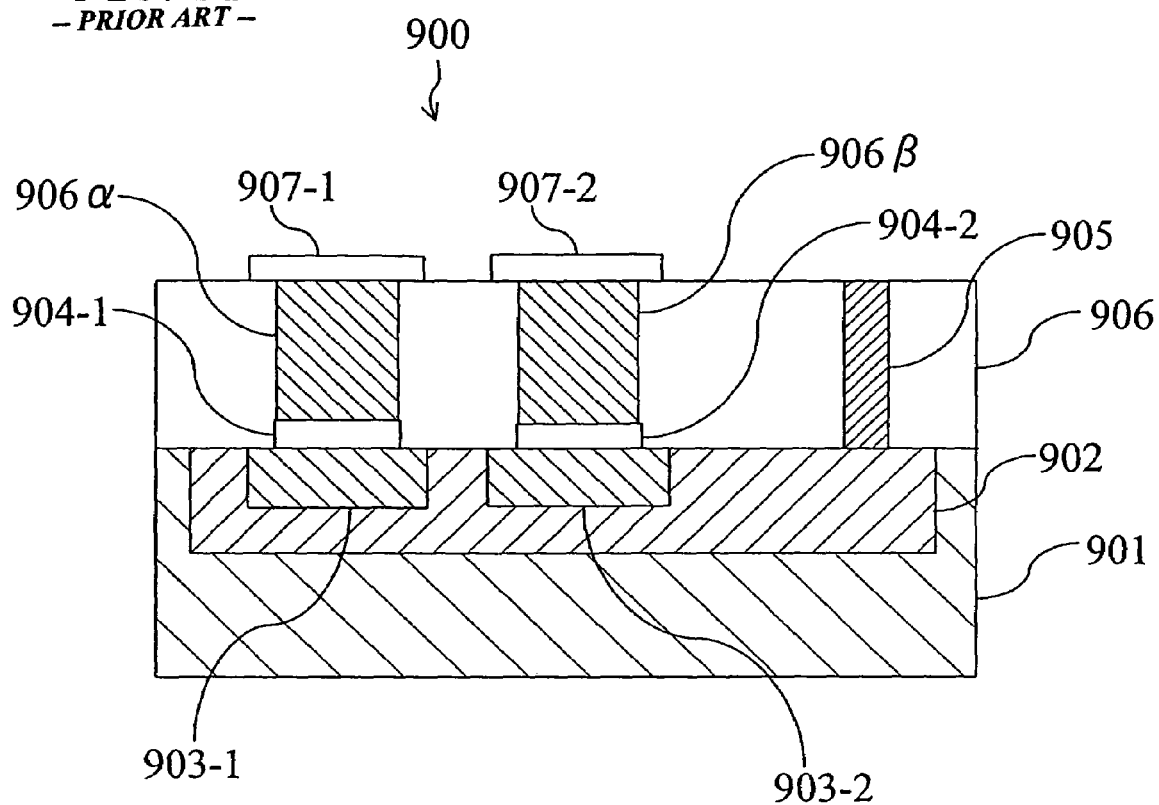
FIG. 22 —PRIOR ART—
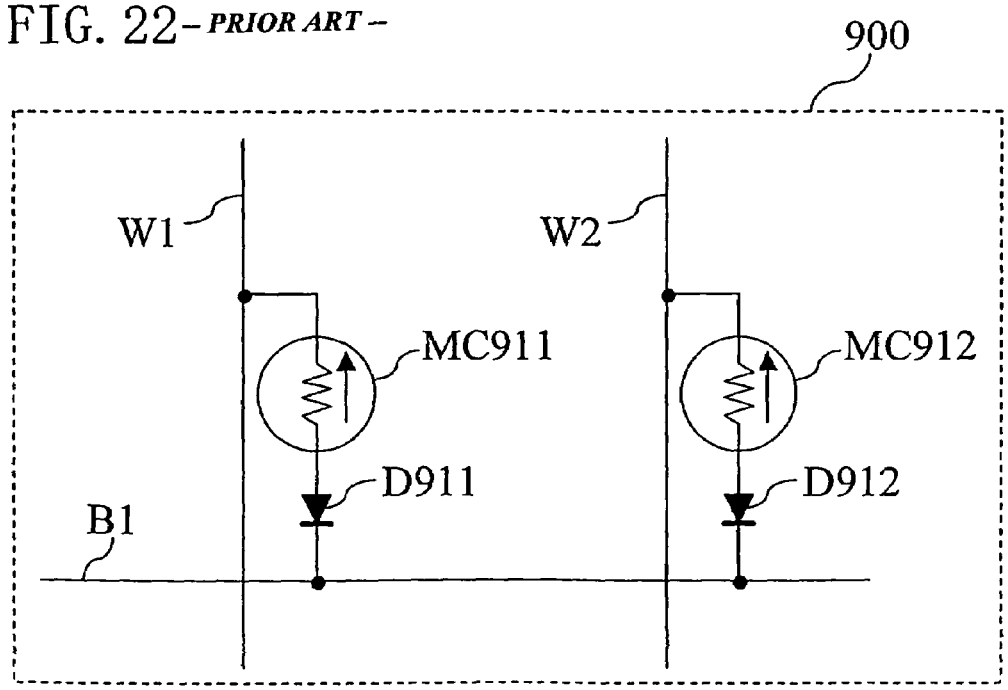

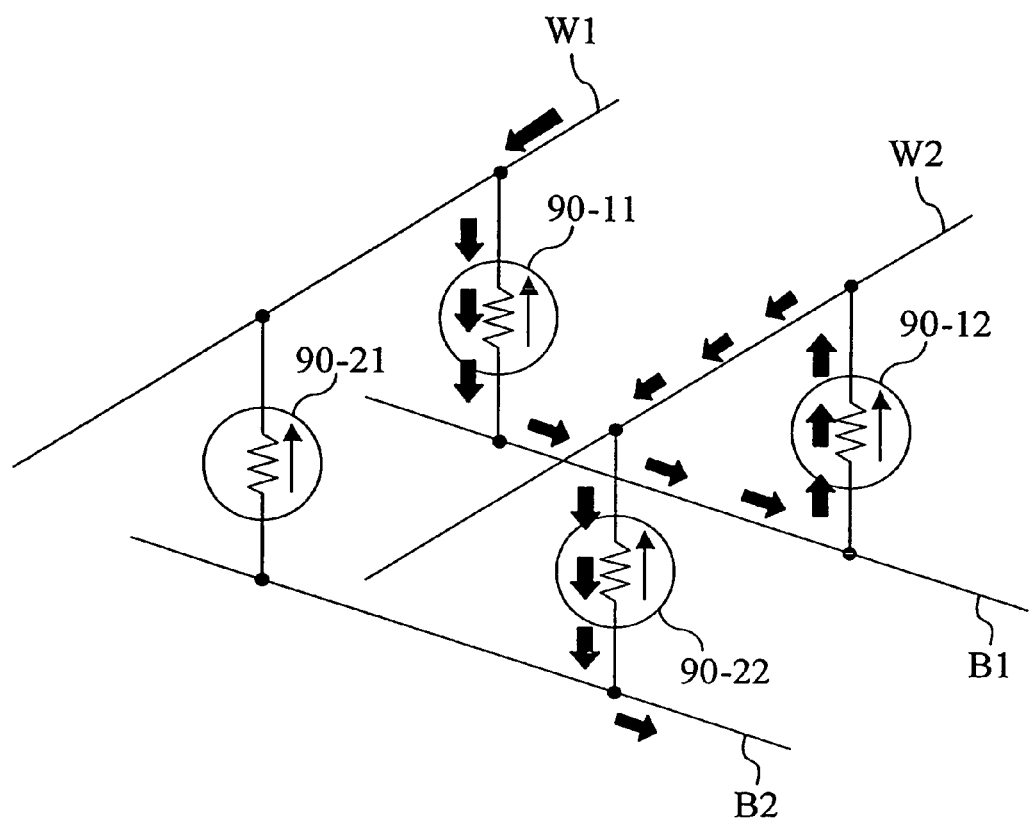
FIG. 23 –PRIOR ART–

MEMORY DEVICE AND SEMICONDUCTOR INTEGRATED CIRCUIT

RELATED APPLICATIONS

This application is the U.S. National Phase under 35 U.S.C. § 371 of International Application No. PCT/JP2006/308433, filed on Apr. 21, 2006, which in turn claims the benefit of Japanese Application No. 2005-125686, filed on Apr. 22, 2005, and Japanese Patent Application No. 2005-308627, filed on Oct. 24, 2005, the disclosures of which Applications are incorporated by reference herein.

TECHNICAL FIELD

The present invention relates to a memory device and semiconductor integrated circuit formed using a state-variable material whose resistance value varies according to an applied pulse voltage.

BACKGROUND ART

In recent years, along with the advancement of the digital techniques in electronic devices, demands for nonvolatile memory devices have been increasing for storage of data, such as a picture, and the like. Further, demands for increasing the capacity of a memory device, reducing the write power, shortening the read and write times, and prolonging the device's life have been escalating. To meet such demands, U.S. Pat. No. 6,204,139 (Patent Document 1) discloses a technique for forming a nonvolatile memory device using a perovskite material whose resistance value varies according to an applied electric pulse (e.g., $Pr_{(1-X)}Ca_XMnO_3$ (PCMO), $LaSrMnO_3$ (LSMO), $GdBaCo_XO_Y$ (GBCO), etc.). According to the technique disclosed in this publication, a predetermined electric pulse is applied to these materials (hereinafter, generically referred to as "variable-resistance material(s)") to increase or decrease the resistance value of the materials. The resistance value which has varied as a result of application of the pulse is used for memorization of different values. Based on this scheme, the materials are used for memory devices.

U.S. Pat. No. 6,673,691 (Patent Document 2) discloses a method for changing the resistance value of a variable-resistance material by changing the pulse width of an electric pulse. U.S. Pat. No. 6,673,691 further discloses an example of a 1D1R (1 diode/1 resistor) memory cell array wherein a memory cell is formed using these variable-resistance materials, and a diode is used as a memory cell selection device. An advantage of this structure is a smaller memory cell size as compared with a structure which includes a transistor as a memory cell selection device.

FIG. 21 shows a memory device (1D1R nonvolatile memory device) 900 formed using a conventional variable-resistance material disclosed in U.S. Pat. No. 6,673,691. In this conventional example, the memory device 900 includes a substrate 901, a P/N junction diode (N-type Si region 902, P-type Si regions 903-1 and 903-2) formed on the substrate 901, a lower electrode 904-1 formed on the P-type Si region 903-1 of the diode, a lower electrode 904-2 formed on the P-type Si region 903-2 of the diode, a contact plug 905 formed on the N-type Si region 902 of the diode, a variable-resistance material layer 906 formed over the lower electrodes 904-1 and 904-2, and upper electrodes 907-1 and 907-2 formed on the variable-resistance material layer 906. In this conventional example, the lower electrodes 904-1 and 904-2 and the upper electrodes 907-1 and 907-2 are formed of Pt, and the variable-resistance material layer 906 is formed of $P_{0.7}Ca_{0.3}MnO_3$.

In the memory device 900 shown in FIG. 21, when a predetermined pulse is applied between the upper electrode 907-1 and the lower electrode 904-1, the resistance value of a portion of the variable-resistance material layer 906 between the upper electrode 907-1 and the lower electrode 904-1 (variable region 906α) is varied. When a predetermined pulse is applied between the upper electrode 907-2 and the lower electrode 904-2, the resistance value of a portion of the variable-resistance material layer 906 between the upper electrode 907-2 and the lower electrode 904-2 (variable region 906β) is varied. That is, in this memory device, each of the variable region 906α and the variable region 906β is used as a single memory cell.

In the memory device 900 shown in FIG. 21, the P/N junction diode formed on the substrate 901 is used as a diode for selection of memory cells. Thus, an electric current flows from the upper electrode 907-1 (907-2) to the lower electrode 904-1 (904-2) (forward direction) but does not flow from the lower electrode 904-1 (904-2) to the upper electrode 907-1 (907-2) (reverse direction) or between the upper electrode 907-1 and the upper electrode 907-2.

FIG. 22 shows an equivalent circuit of the memory device 900 of FIG. 21. In FIG. 22, a word line W1 corresponds to the upper electrode 907-1, a word line W2 corresponds to the upper electrode 907-2, and a bit line B1 corresponds to the contact plug 905. A memory cell MC911 corresponds to the variable region 906α, a diode D911 corresponds to the diode (N-type Si region 902, P-type Si region 903-1), a memory cell MC912 corresponds to the variable region 906β, and a diode D912 corresponds to the diode (N-type Si region 902, P-type Si region 903-2).

<Operation>

Next, an operation of the memory device 900 of FIG. 21 is described with reference to FIG. 22. Herein, a process with the memory cell MC911 is described.

[Set (Memorization) or Reset]

In a memorization process, the word line W2 and the bit line B1 are pulled down to the ground, and a predetermined electric pulse is applied to the word line W1. As a result, the resistance value of the memory cell MC911 changes to a low resistance state (reset) or high resistance state (set). In an example disclosed in U.S. Pat. No. 6,673,691, when a pulse voltage having a voltage value of +4 V and a pulse width of 100 nsec is applied, the resistance value of the memory cell MC911 changes from the high resistance state to the low resistance state. When a pulse voltage having a voltage value of +2.5 V and a pulse width of 10 μsec is applied, the resistance value of the memory cell MC911 changes from the low resistance state to the high resistance state.

[Reproduction]

In a reproduction process, the word line W2 and the bit line B1 are pulled down to the ground, and a predetermined reproduction voltage (e.g., a voltage having a voltage value of +0.5 V) is applied to the word line W1. As a result, the electric current flowing through the memory cell MC911 is released to the bit line B1. On the other hand, no electric current flows through the memory cell MC912. Since the diode D912 (the N-type Si region 902 and P-type Si region 903-2 of FIG. 21) is provided to the memory cell MC912, no electric current flows from the word line W1 to the word line W2. Thus, only the resistance value of the memory cell MC911 can be detected.

According to the schemes as described above, the conventional memory device (1D1R nonvolatile memory device) 900 performs recording or reproduction in each memory cell.

U.S. Pat. No. 6,531,371 (Patent Document 3) realizes a larger-capacity memory device by constructing a cross point type memory device using a variable-resistance material. Specifically, as shown in FIG. 23, the intersections (cross points) of word lines W1 and W2 and bit lines B1 and B2 are respectively provided with memory cells 90-11, 90-12, 90-21, and 90-22, whereby the cross point type memory device is realized. The memory cells 90-11 through 90-22 are formed of a variable-resistance material.

However, in the memory device of FIG. 23, if a memory cell adjacent to a target memory cell from which information is to be read (e.g., variable-resistance material portions 90-11, 90-12, 90-22 adjacent to variable-resistance material portion 90-21) has a low resistance value, a current flows not only through the target memory cell but also through the adjacent memory cell as shown in FIG. 23, so that there is a possibility that the state of resistance in the target memory cell cannot be determined. In view of such, as disclosed in Japanese PCT National Phase Laid-Open Patent Publication No. 2002-530850 (Patent Document 4), a cross point type memory device has been proposed wherein a state-variable portion functioning as a memory cell and a diode called a steering portion are connected in series.

[Patent Document 1] U.S. Pat. No. 6,204,139

[Patent Document 2] U.S. Pat. No. 6,673,691

[Patent Document 3] U.S. Pat. No. 6,531,371

[Patent Document 4] Japanese PCT National Phase Laid-Open Patent Publication No. 2002-530850

[Non-Patent Document 1] 2002 IEDM, Article No. 7.5, December 2002

DISCLOSURE OF INVENTION

Problems to be Solved by the Invention

However, in such a device using a diode (1D1R nonvolatile memory device), it is necessary to form a diode of P/N junction on the substrate 901. To form a memory cell, it is further necessary to form the lower electrodes 904-1 and 904-2 and the variable-resistance material layer 906 on the diode. Such a structure requires a complicated production process and is therefore unsuitable for practical use. It should be further noted that, in the memory device 900 of FIG. 21, even if a pulse voltage is applied to the variable region 906α (906β) such that the upper electrode 907-1 (907-2) becomes negative (−) with respect to the lower electrode 904-1 (904-2), it does not mean application of a predetermined pulse voltage to the variable region 906α (906β) because the diode is formed. That is, in the memory device 900 of FIG. 21, in order to allow the resistance value of the variable region 906α (906β) to vary, it is necessary to apply a pulse voltage such that the upper electrode 907-1 (907-2) becomes positive (+) with respect to the lower electrode 904-1 (904-2). Thus, the polarity of a pulse voltage to be applied to the variable-resistance material is restricted.

In the memory device 900 of FIG. 21, the interval of 100 nsec is required for changing (setting) the resistance state of a memory cell from the high resistance state to the low resistance state, and the interval of 10 μsec is required for changing (resetting) the resistance state of a memory cell from the low resistance state to the high resistance state. To quickly perform setting or resetting of this memory cell, it is necessary to shorten the pulse width of a pulse voltage to be applied.

The cross point type memory device disclosed in Patent Document 4 has a very complicated production process. The production process is considered complicated for a multilayered structure for a 3-dimensional structure.

Means for Solving the Problems

According to one aspect of the present invention, a memory device includes a first electrode layer, a state-variable layer and a second electrode layer. The first electrode layer includes a plurality of first electrode lines extending parallel to each other. The state-variable layer lies on the first electrode layer and includes a plurality of state-variable portions which exhibits a diode characteristic and a variable-resistance characteristic. The second electrode layer lies on the state-variable layer and includes a plurality of second electrode lines extending parallel to each other. The plurality of first electrode lines and the plurality of second electrode lines are crossing each other when seen in a layer-stacking direction with the state-variable layer interposed therebetween. Each of the plurality of state-variable portions is provided at an intersection of any one of the plurality of first electrode lines and any one of the plurality of second electrode lines between the first electrode line and the second electrode line. Each of the plurality of state-variable portions exhibits a diode characteristic such that a forward direction is the direction extending from one of the first electrode line and the second electrode line to the other while a reverse direction is opposite to the forward direction. Each of the plurality of state-variable portions exhibits a variable-resistance characteristic such that a resistance value of the state-variable portion in the forward direction increases/decreases according to a predetermined pulse voltage applied between the first electrode line and the second electrode line.

In this memory device, it is not necessary to provide a diode, and therefore, the production process is simplified, as compared with the structure of a conventional 1D1R nonvolatile memory. Also, the state-variable portions have the "diode characteristic". Thus, even if a state-variable portion adjacent to a process target state-variable portion has a small resistance value, a superfluous current does not flow through the adjacent state-variable portion. Thus, the resistance value of the process target state-variable portion can be determined accurately.

Preferably, the above-described memory device further includes a plurality of first electrodes and a plurality of second electrodes which correspond to the plurality of state-variable portions. Each of the plurality of first electrodes intervenes between a state-variable portion corresponding to the first electrode and a first electrode line corresponding to the state-variable portion. Each of the plurality of second electrodes intervenes between a state-variable portion corresponding to the second electrode and a second electrode line corresponding to the state-variable portion. Each of the plurality of state-variable portions exhibits a diode characteristic such that a forward direction is the direction extending from one of the corresponding first and second electrodes to the other electrode while a reverse direction is opposite to the forward direction. Each of the plurality of state-variable portions exhibits a variable-resistance characteristic such that a resistance value of the state-variable portion in the forward direction increases/decreases according to a predetermined pulse voltage applied between the first electrode and the second electrode.

According to another aspect of the present invention, a memory device includes a first electrode layer, a state-variable layer and a second electrode layer. The first electrode layer includes a plurality of first electrode lines extending parallel to each other. The state-variable layer lies on the first electrode layer and is formed of a state-variable material which exhibits a diode characteristic and a variable-resistance characteristic. The second electrode layer lies on the state-variable layer and includes a plurality of second electrode lines extending parallel to each other. The plurality of first electrode lines and the plurality of second electrode lines are crossing each other when seen in a layer-stacking direction with the state-variable layer interposed therebetween. In the state-variable layer, a state-variable portion which is a variable region interposed between any one of the plurality of first electrode lines and any one of the plurality of second electrode lines exhibits a diode characteristic such that a forward direction is the direction extending from one of the first electrode line and the second electrode line to the other while a reverse direction is opposite to the forward direction. The state-variable portion exhibits a variable-resistance characteristic such that a resistance value of the state-variable portion in the forward direction increases/decreases according to a predetermined pulse voltage applied between the first electrode line and the second electrode line.

In this memory device, it is not necessary to provide a diode, and therefore, the production process is simplified, as compared with the structure of a conventional 1D1R nonvolatile memory. Also, the state-variable layer has the "diode characteristic". Thus, even if a variable region adjacent to a process target variable region has a small resistance value, a superfluous current does not flow through the adjacent variable region. Thus, the resistance value of the process target variable region can be determined accurately.

Preferably, the work function of each of the plurality of first electrode lines is different from the work function of each of the plurality of second electrode lines.

In the above-described memory device, when the first electrode and the second electrode have different work functions, the state-variable material exhibits the diode characteristic and the variable-resistance characteristic. Therefore, by providing a difference between the work functions of the first electrode and the second electrode, a state-variable portion can be formed wherein the state-variable material exhibits the "diode characteristic" and the "variable-resistance characteristic".

Preferably, the work function of each of the plurality of first electrodes is different from the work function of each of the plurality of second electrodes.

Preferably, the crystallinity of the state-variable material in each of the plurality of state-variable portions is nonuniform.

In the above-described memory device, when the crystallinity of the state-variable material is nonuniform, the state-variable material exhibits the diode characteristic and the variable-resistance characteristic. Therefore, by making the crystallinity of the state-variable material nonuniform, a state-variable portion can be formed wherein the state-variable material exhibits the "diode characteristic" and the "variable-resistance characteristic".

Preferably, the crystallinity of the state-variable material in the state-variable layer is nonuniform.

Preferably, the above-described memory device further includes: a first electrode line driver for applying a predetermined voltage to the plurality of first electrode lines; and a second electrode line driver for applying a predetermined voltage to the plurality of second electrode lines.

In the above-described memory device, the state-variable portion has the "diode characteristic". Therefore, no electric current flows from a first electrode line to another first electrode line. Thus, a memory device can be produced without additionally providing a diode element.

Preferably, in order to store information in any one of the plurality of state-variable portions, the first electrode line driver applies a first pulse voltage to one of the plurality of first electrode lines corresponding to the state-variable portion in which the information is to be stored. The second electrode line driver applies a second pulse voltage to one of the plurality of second electrode lines corresponding to the state-variable portion in which the information is to be stored.

In the above-described memory device, a predetermined pulse voltage is applied to a state-variable portion in which information is to be stored, while the predetermined pulse voltage is not applied to the other state-variable portions. As a result, only the resistance state of the state-variable portion in which information is to be stored can be changed. That is, it is possible to arbitrarily select a state-variable portion and store information in the selected state-variable portion.

Preferably, in order to reproduce information stored in any one of the plurality of state-variable portions, the first electrode line driver applies a reproduction voltage to one of the plurality of first electrode lines corresponding to the state-variable portion from which the information is to be read, and the second electrode line driver applies the reproduction voltage to the plurality of second electrode lines except for one corresponding to the state-variable portion from which the information is to be read.

In the above-described memory device, in the state-variable portion from which the information is to be read, an electric current flows in the forward direction, while no electric current flows in the forward direction in the other state-variable portions. Thus, it is possible to read only the electric current flowing through the state-variable portion from which information is to be read. That is, it is possible to arbitrarily select a state-variable portion and read information stored in the selected state-variable portion.

According to still another aspect of the present invention, a semiconductor integrated circuit includes the above-described memory device and a logic circuit for performing a predetermined operation. The logic circuit has a memorization mode and a processing mode. The logic circuit in the memorization mode stores bit data in the memory device. The logic circuit in the processing mode reads bit data stored in the memory device.

According to still another aspect of the present invention, a semiconductor integrated circuit includes the above-described memory device and a processor having a program execution mode and a program rewrite mode. The processor in the program execution mode operates according to a program stored in the memory device. The processor in the program rewrite mode replaces a program stored in the memory device with an externally-input new program.

Preferably, the state-variable material is a metal oxide having a spinel structure.

Preferably, the state-variable material is a ferroelectric oxide containing a metal added thereto.

Preferably, the ferroelectric oxide has an ilmenite structure.

Preferably, the state-variable material is a metal oxide having a perovskite structure.

Preferably, the metal oxide has at least one of a CMR (Colossal Magneto-Resistance) characteristic and high-temperature superconductivity.

Preferably, the state-variable material does not contain an alkali metal or alkaline-earth metal.

Effects of the Invention

Since the state-variable portion has the "diode characteristic", the direction of the electric current can be defined without using a diode element therefor. Further, the state-variable portion has the "variable-resistance characteristic" and therefore can be used as, for example, a 1D1R nonvolatile memory. In such a use, it is not necessary to provide a diode, and therefore, the production process is simplified, as compared with a conventional 1D1R nonvolatile memory. In a method for changing the resistance value according to the polarity of the pulse voltage, the pulse width of a pulse voltage applied is short as compared with a conventional pulse application method (a method wherein the resistance value of the variable-resistance material is changed by adjusting the pulse width of the pulse voltage). That is, the time required for memorization or reset can be shortened.

BRIEF DESCRIPTION OF DRAWINGS

FIG. 21 shows a structure of a conventional memory device.

FIG. 22 shows an equivalent circuit of the memory device of FIG. 21.

FIG. 23 shows a conventional cross point type memory device.

DESCRIPTION OF REFERENCE NUMERALS

Figure 1:
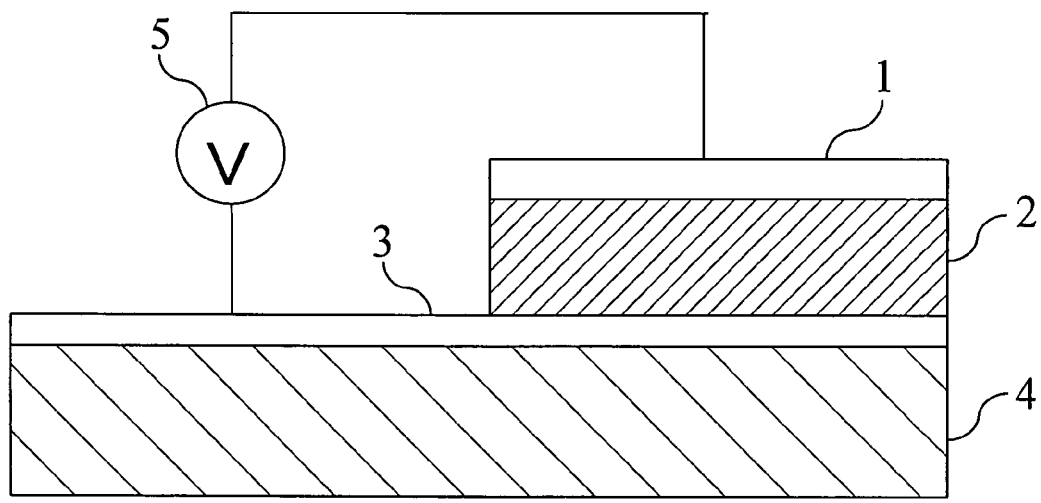
FIG. 1 shows a basic structure of an electric element.

1 Upper electrode
2 State variable material layer
3 Lower electrode
4 Substrate
5 Power supply
101-1, 101-2 Terminal
102 Electric element
200, 500 Memory device
201 Memory array
202 Address buffer
203 Control section
204 Row decoder
205 Word line driver
206 Column decoder
207 Bit line driver
MC211, MC212, MC221, MC222, MC511, MC512 Memory cell
W1, W2 Word lines
B1, B2 Bit lines
300 Semiconductor integrated circuit
301 Logic circuit
400 Semiconductor integrated circuit
401 Processor
402 Interface
501 Substrate
502 Lower electrode
503 State-variable material layer
503α, 503β State-variable region
504 Contact plug
505-1, 505-2 Upper electrode
60-11 to 60-22 State-variable portion
60α-11 to 60α-22 State-variable region

BEST MODE FOR CARRYING OUT THE INVENTION

Hereinafter, embodiments of the present invention are described in detail with reference to the drawings. In this specification, like reference numerals are denoted by like elements, and descriptions thereof are not repeated.

(Basic Structure and Basic Characteristics of Electric Element)

The basic structure and basic characteristics of an electric element used in the embodiments of the present invention are described.

FIG. 1 shows a basic structure of the electric element. The electric element includes a substrate 4, a lower electrode 3 formed on the substrate 4, a state-variable material layer 2 formed on the lower electrode 3, and an upper electrode 1 formed on the state-variable material layer 2. A power supply 5 applies a predetermined voltage between the upper electrode 1 and the lower electrode 3.

According to the present invention, the state-variable material of the state-variable material layer 2 exhibits a characteristic such that an electric current readily flows in the forward direction but does not readily flow in the reverse direction (diode characteristic) and a characteristic such that the resistance value is increased or decreased by application of a predetermined pulse voltage (variable-resistance characteristic). The state-variable material of the layer 2 is a metal oxide material of a spinel structure, a ferroelectric oxide including an ilmenite structure metal added thereto, or a perovskite-structured material having at least one of CMR characteristic and high-temperature superconductivity. Specifically, the state-variable material of the layer 2 can be selected from the following materials: $CoFe_2O_4$, $CuFe_2O_4$, $NiCr_2O_4$, $Fe_3O_4$, Cr—$SrTiO_3$, Sr—$LiNbO_3$, Mg—$LiNbO_3$, $Pr_{(1-X)}Ca_XMnO_3$ (0<X<0.5), $LaSrMnO_3$, $GdBaCo_XO_Y$ (0<X<2, 0<Y<7), etc.

Next, a method for realizing the state-variable material layer 2 having the above-described characteristics (variable-resistance characteristic and diode characteristic) is described.

EXAMPLE 1

To realize the state-variable material layer 2 having the above-described characteristics (variable-resistance characteristic and diode characteristic), the upper electrode 1 and the lower electrode 3 are formed of different materials having different work functions in the electric element of FIG. 1. The reasons therefor are described below.

<Subjects of Experiments>

We carried out experiments on the following three types of electric elements.

Sample (A): Electric element in which the work function of the upper electrode 1 is smaller than that of the lower electrode 3.

Sample (B): Electric element in which the work function of the upper electrode 1 is greater than that of the lower electrode 3.

Sample (C): Electric element in which the work function of the upper electrode 1 is equal to that of the lower electrode 3.

After the formation of sample (A), sample (B) and sample (C), a pulse voltage (voltage value: +3 V, pulse width: 10 μsec) was applied to the state-variable material layer 2 such that the upper electrode 1 became positive (+) with respect to the lower electrode 3, whereby the resistance value of the state-variable material layer 2 was initially set to a resistance value which was lower than the resistance value measured immediately after the formation (about 1 MΩ) by about slightly more than one order of magnitude. (This initialization was carried out according to a method described in Japanese Patent Application No. 2003-421374 (PCT/JP2004/019291), which is incorporated herein by reference.)

<Experiments>

In example 1, we carried out the following experiments on sample (A), sample (B) and sample (C).

[Experiment 1]

Pulse voltages which are to make the upper electrode 1 positive (+) with respect to the lower electrode 3 (hereinafter, referred to as "positive (+) pulse voltage(s)") and pulse voltages which are to make the upper electrode 1 negative (−) with respect to the lower electrode 3 (hereinafter, referred to as "negative (−) pulse voltage(s)") are alternately applied to the state-variable material layer 2 on a one-by-one basis (see FIG. 2). Every time application of one pulse voltage is completed, a voltage which is to make the upper electrode 1 positive (+) with respect to the lower electrode 3 (hereinafter, referred to as "positive (+) measurement voltage") is applied to the state-variable material layer 2 in order to measure the resistance value of the state-variable material layer 2.

[Experiment 2]

Figure 2:
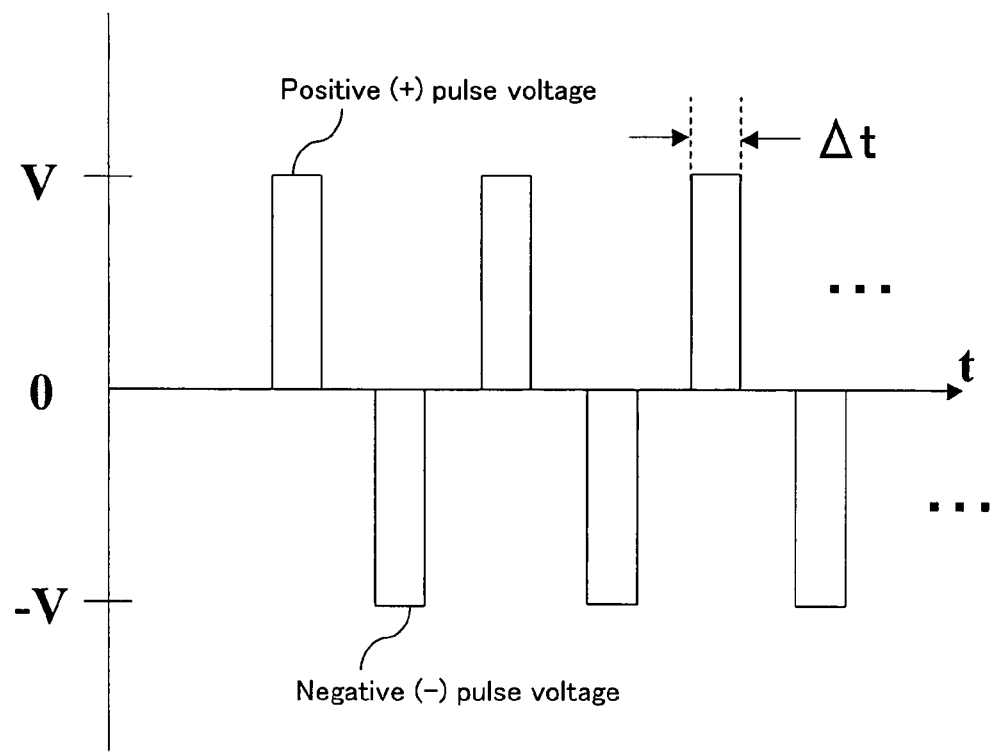
FIG. 2 shows a waveform of a pulse voltage to be applied.

Positive (+) pulse voltages and negative (−) pulse voltages are alternately applied to the state-variable material layer 2 on a one-by-one basis (see FIG. 2). Every time application of one pulse voltage is completed, a voltage which is to make the upper electrode 1 negative (−) with respect to the lower electrode 3 (hereinafter, referred to as "negative (−) measurement voltage") is applied to the state-variable material layer 2 in order to measure the resistance value of the state-variable material layer 2.

[Experiment 3]

Positive (+) pulse voltages and negative (−) pulse voltages are alternately applied to the state-variable material layer 2 on a one-by-one basis (see FIG. 2). Every time application of one pulse voltage is completed, the current-voltage characteristic of the state-variable material layer 2 is measured.

The voltages applied in the above experiments are as follows.

Positive (+) pulse voltage: voltage value: +3 V, pulse width: 50 nsec
Negative (−) pulse voltage: voltage value: −3 V, pulse width: 50 nsec
Positive (+) measurement voltage: voltage value: +0.5 V
Negative (−) measurement voltage: voltage value: −0.5 V <Experiments on Sample (A)>

Figure 3A:
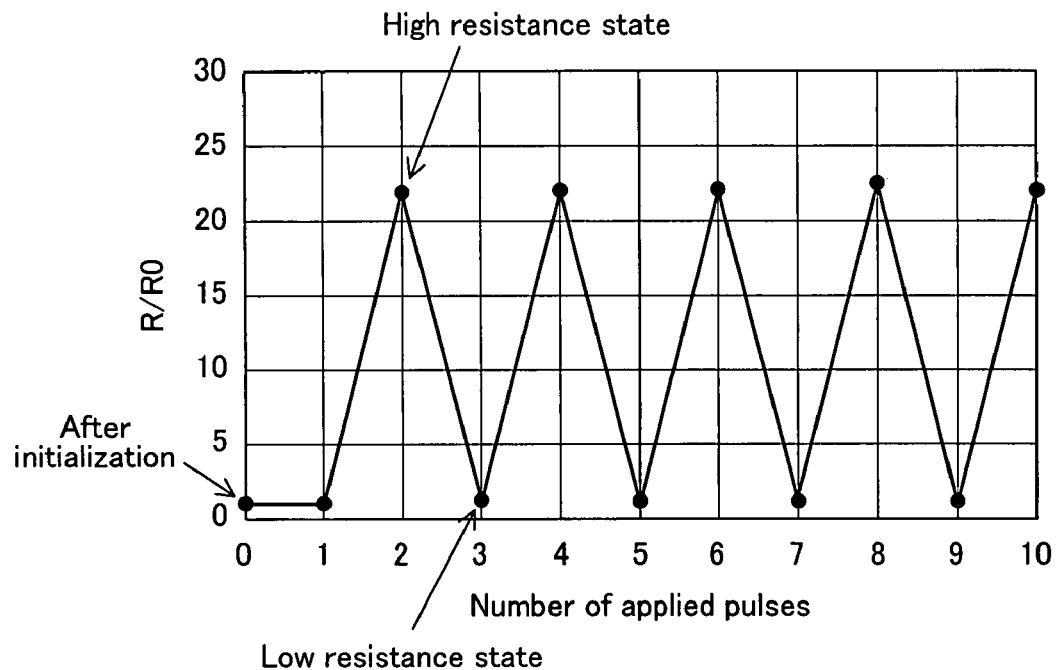
FIG. 3A shows a variation in resistance value which occurs due to pulse voltages of different polarities when a pulse voltage of the first polarity is applied to an electric element.
Figure 3B:
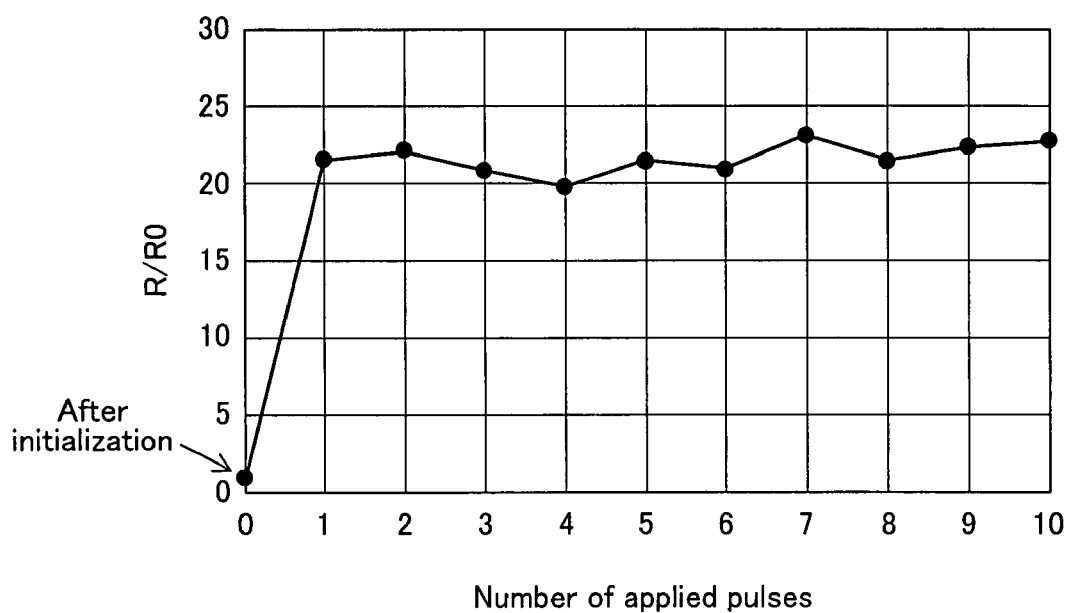
FIG. 3B shows a variation in resistance value which occurs due to pulse voltages of different polarities when a pulse voltage of the second polarity is applied to the electric element.

In the first place, experiments on sample (A) are described with reference to FIG. 3A, FIG. 3B, FIG. 4A and FIG. 4B. In FIG. 3A and FIG. 3B, the vertical axis represents a value obtained by normalizing measured value R with resistance value R0 measured immediately after initialization (the same applies to FIG. 6, FIG. 8A, FIG. 8B and FIG. 9).

[Materials Used]

Upper electrode 1: Ag (thickness: about 0.2 μm, work function: 4.3 eV (=electron volts))
State-variable material layer 2: $CuFe_2O_4$ (thickness: about 0.1 μm)
Lower electrode 3: Pt (thickness: about 0.2 μm, work function: 5.7 eV)

[Result of Experiment 1]

Experiment 1 was carried out on sample (A). The experimental result is shown in FIG. 3A. After the application of the positive (+) pulse voltage, the measured value changed from a high resistance state (a state where the resistance value is high as compared with the other state) to a low resistance state (a state where the resistance value is low as compared with the other state). After the application of the negative (−) pulse voltage, the measured value changed from the low resistance state to the high resistance state. Thus, it was found that the resistance value for the direction extending from the upper electrode 1 to the lower electrode 3 (the resistance value of the state-variable material layer 2) increases or decreases according to the applied pulse voltage.

[Result of Experiment 2]

Experiment 2 was carried out on sample (A). The experimental result is shown in FIG. 3B. Even after the application of the positive (+) pulse voltage, the measured value was maintained at the high resistance state. Thus, it was found that the resistance value for the direction extending from the lower electrode 3 to the upper electrode 1 (the resistance value of the state-variable material layer 2) always exhibits the high resistance state irrespective of the applied pulse voltage.

[Result of Experiment 3]

Figure 4A:
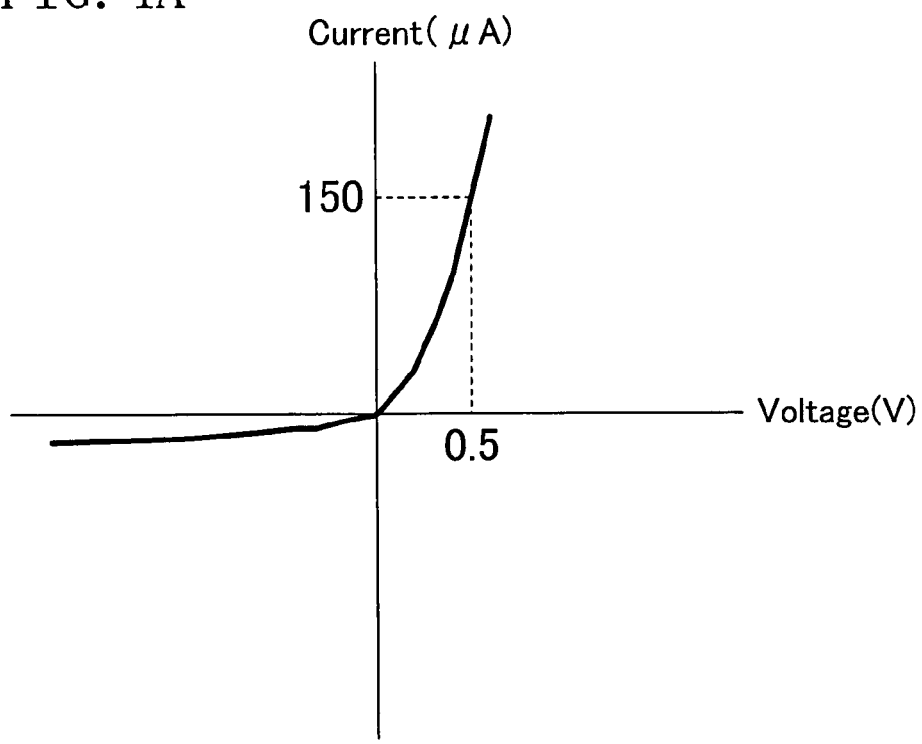
FIG. 4A shows the current-voltage characteristic measured after a pulse voltage of the first polarity is applied to an electric element.

Experiment 3 was carried out on sample (A). The current-voltage characteristic measured after the application of the positive (+) pulse voltage is shown in FIG. 4A. As seen from FIG. 4A, after the application of the positive (+) pulse voltage, application of the positive (+) measurement voltage resulted in that the value of the flowing current increased as the absolute value of the positive (+) measurement voltage increased. Namely, it was found that the current readily flowed. On the other hand, application of the negative (−) measurement voltage resulted in that the value of the flowing current did not increase even though the absolute value of the negative (−) measurement voltage was increased. Within the actual coverage of the experiment, the absolute value of the flowing current was 20 µA or less, so that the current did not readily flow. Thus, it was found that, after the application of the positive (+) pulse voltage, an electric current (electric current flowing through the state-variable material layer 2) readily flows in the direction extending from the upper electrode 1 to the lower electrode 3, but the electric current does not readily flow in the direction extending from the lower electrode 3 to the upper electrode 1.

Figure 4B:
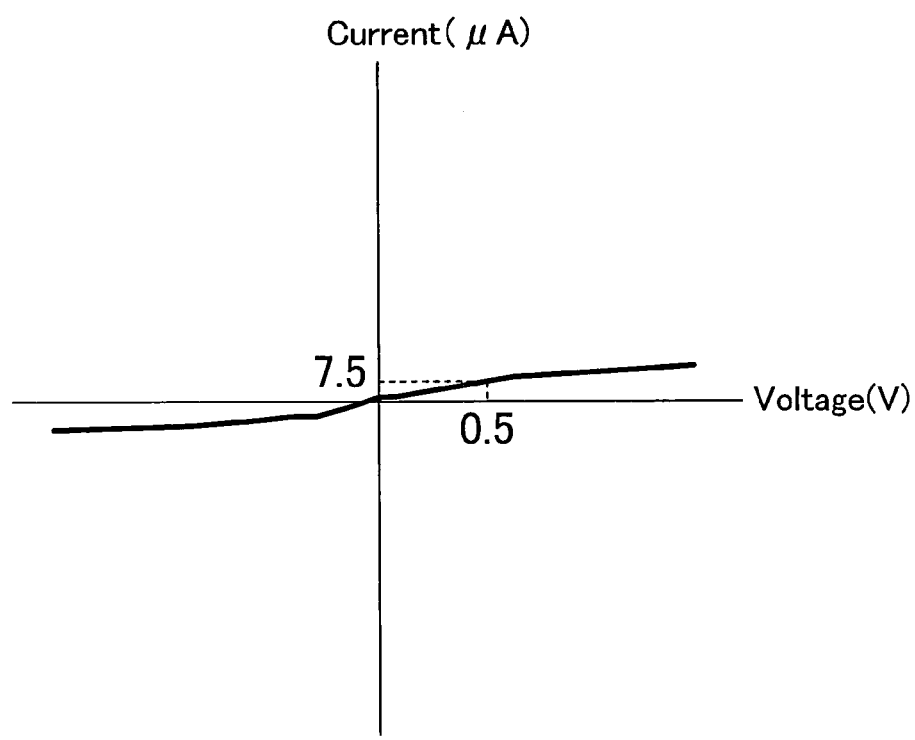
FIG. 4B shows the current-voltage characteristic measured after a pulse voltage of the second polarity is applied to the electric element.

The current-voltage characteristic measured after the application of the negative (−) pulse voltage is shown in FIG. 4B. As seen from FIG. 4B, after the application of the negative (−) pulse voltage, the electric current did not readily flow even when the positive (+) measurement voltage was applied. Thus, it was found that, after the application of the negative (−) pulse voltage, the electric current does not readily flow in the direction extending from the upper electrode 1 to the lower electrode 3 as compared with the electric current flowing after the application of the positive (+) pulse voltage. Namely, as for sample (A), application of a voltage in the forward direction (from the upper electrode 1 to the lower electrode 3) exponentially increases the flowing current (rightward along the horizontal axis in FIG. 4A), whereas application of a voltage in the reverse direction (from the lower electrode 3 to the upper electrode 1) results in that a current rarely flows (leftward along the horizontal axis in FIG. 4A). In other words, it was found that, it exhibits the diode characteristic which has such a rectification effect that a current flows only in one direction, specifically, a sufficiently larger current flows in the forward direction (from the upper electrode 1 to the lower electrode 3) than in the reverse direction (from the lower electrode 3 to the upper electrode 1).

[Verification Result]

From the above experiments, it was found that sample (A) exhibits the following characteristics.
(1) Diode characteristic such that the direction extending from the upper electrode 1 to the lower electrode 3 is the forward direction, and the direction extending from the lower electrode 3 to the upper electrode 1 is the reverse direction.
(2) Characteristic such that the resistance value for the forward direction increases or decreases according to the applied pulse voltage (variable-resistance characteristic).

Specifically, the resistance value for the forward direction decreases in response to the application of the positive (+) pulse voltage but increases in response to the application of the negative (−) pulse voltage.

<Experiments on Sample (B)>

Next, the results of experiments on sample (B) are described with reference to FIG. 3A, FIG. 3B, FIG. 5A and FIG. 5B.

[Materials Used]

Upper electrode 1: Pt (thickness: about 0.2 µm, work function: 5.7 eV)

State-variable material layer 2: $CuFe_2O_4$ (thickness: about 0.1 µm)

Lower electrode 3: Ti (thickness: about 0.2 µm, work function: 4.3 eV)

<Experimental Results>

[Result of Experiment 1]

Experiment 1 was carried out on sample (B). The experimental result was as shown in FIG. 3B. The measured value was maintained at the high resistance state both even after the application of the positive (+) pulse voltage and even after the application of the negative (−) pulse voltage. Thus, it was found that the resistance value for the direction extending from the upper electrode 1 to the lower electrode 3 (the resistance value of the state-variable material layer 2) always exhibits the high resistance state irrespective of the applied pulse voltage.

[Result of Experiment 2]

Experiment 2 was carried out on sample (B). The experimental result was as shown in FIG. 3A. After the application of the positive (+) pulse voltage, the measured value changed from a high resistance state (a state where the resistance value is high as compared with the other state) to a low resistance state (a state where the resistance value is low as compared with the other state). After the application of the negative (−) pulse voltage, the measured value changed from the low resistance state to the high resistance state. Thus, it was found that the resistance value for the direction extending from the lower electrode 3 to the upper electrode 1 (the resistance value of the state-variable material layer 2) increases or decreases according to the applied pulse voltage.

[Result of Experiment 3]

Figure 5A:
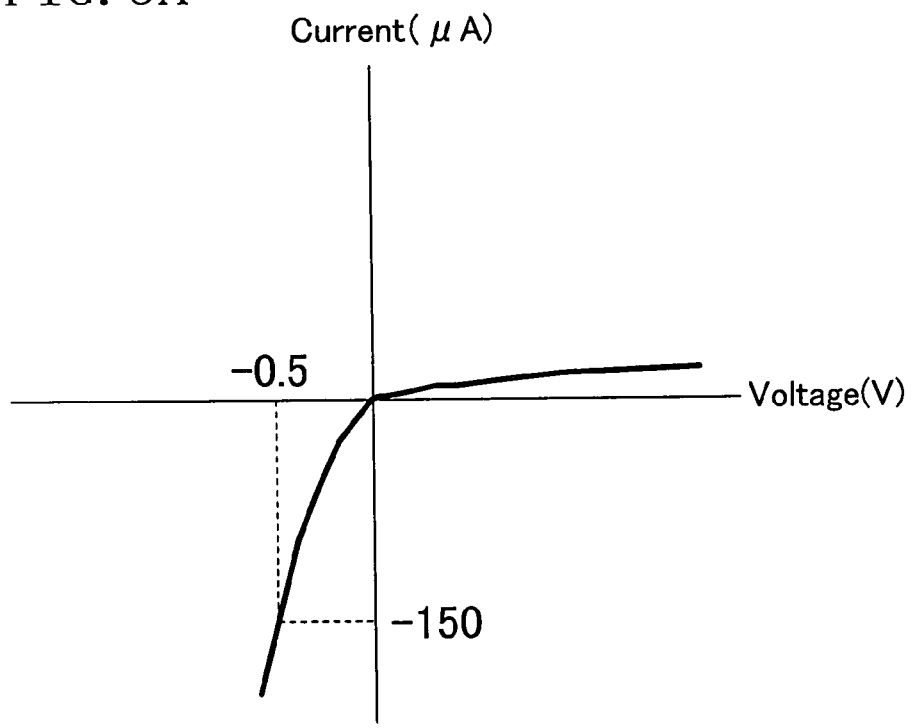
FIG. 5A shows the current-voltage characteristic measured after a pulse voltage of the first polarity is applied to an electric element.

Experiment 3 was carried out on sample (B). The current-voltage characteristic measured after the application of the positive (+) pulse voltage is shown in FIG. 5A. As seen from FIG. 5A, after the application of the positive (+) pulse voltage, an electric current did not readily flow when the positive (+) measurement voltage was applied, whereas an electric current readily flowed when the negative (−) measurement voltage was applied. Thus, it was found that, after the application of the positive (+) pulse voltage, an electric current (electric current flowing through the state-variable material layer 2) does not readily flow in the direction extending from the upper electrode 1 to the lower electrode 3, but the electric current readily flows in the direction extending from the lower electrode 3 to the upper electrode 1.

Figure 5B:
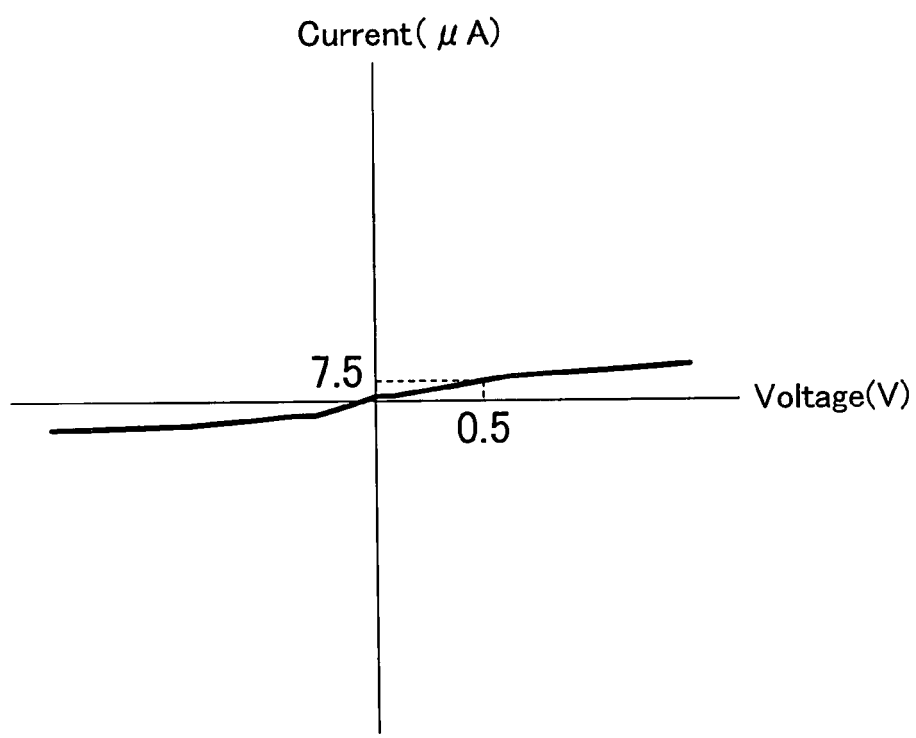
FIG. 5B shows the current-voltage characteristic measured after a pulse voltage of the second polarity is applied to the electric element.

The current-voltage characteristic measured after the application of the negative (−) pulse voltage is shown in FIG. 5B. As seen from FIG. 5B, after the application of the negative (−) pulse voltage, the electric current did not readily flow even when the negative (−) measurement voltage was applied. Thus, it was found that, after the application of the negative (−) pulse voltage, the electric current does not readily flow in the direction extending from the lower electrode 3 to the upper electrode 1 as compared with the electric current flowing after the application of the positive (+) pulse voltage.

[Verification Result]

From the above experiments, it was found that sample (B) exhibits the following characteristics.

(1) Diode characteristic such that the direction extending from the lower electrode 3 to the upper electrode 1 is the forward direction, and the direction extending from the upper electrode 1 to the lower electrode 3 is the reverse direction.

(2) Characteristic such that the resistance value for the forward direction increases or decreases according to the applied pulse voltage (variable-resistance characteristic). Specifically, the resistance value for the forward direction decreases in response to the application of the positive (+) pulse voltage but increases in response to the application of the negative (−) pulse voltage.

<Experiments on Sample (C)>

Figure 6:
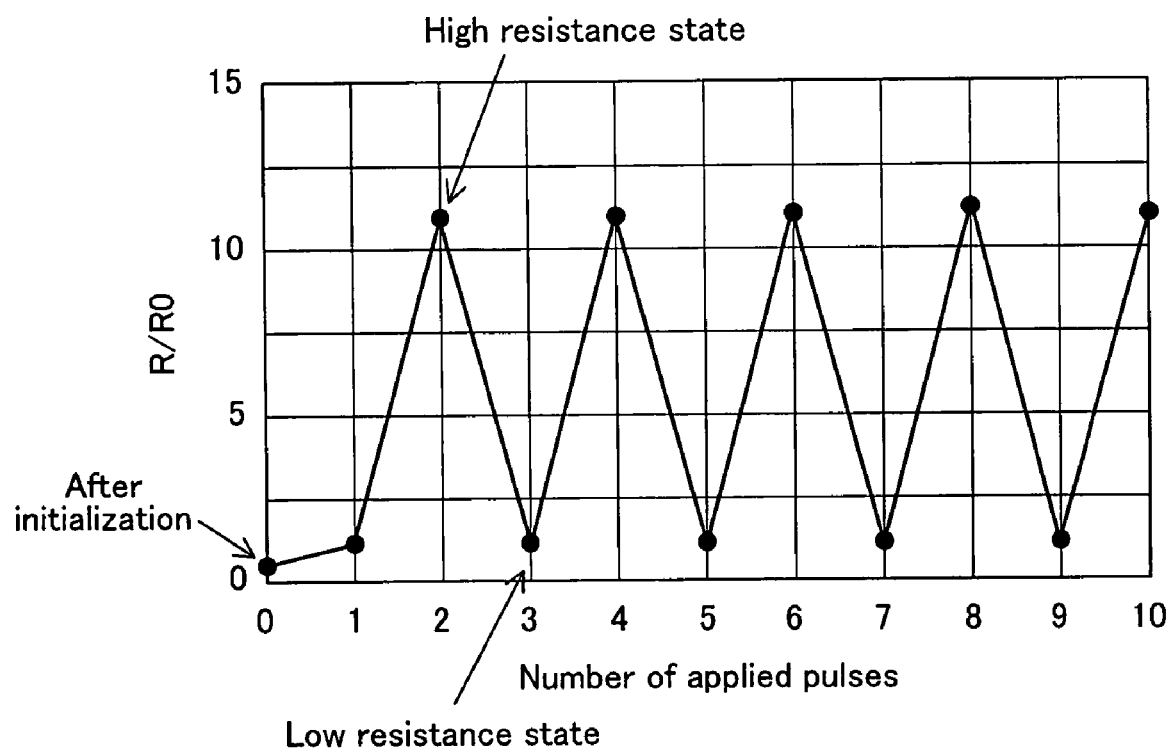
FIG. 6 shows a variation in resistance value which occurs due to pulse voltages of different polarities when a pulse voltage is applied to an electric element.
Figure 7A:
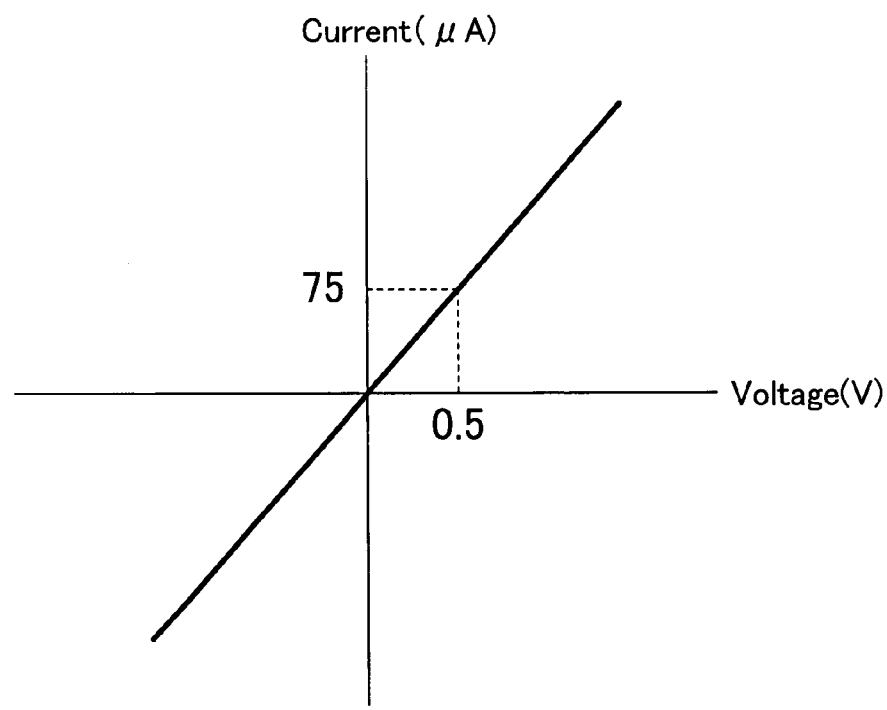
FIG. 7A shows the current-voltage characteristic measured after a pulse voltage of the first polarity is applied to an electric element.
Figure 7B:
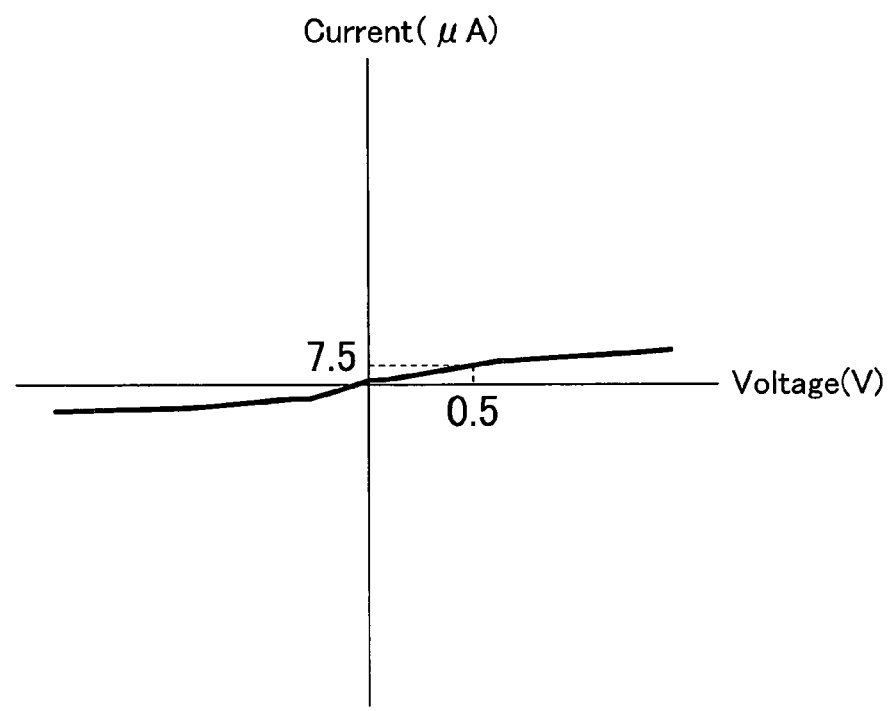
FIG. 7B shows the current-voltage characteristic measured after a pulse voltage of the second polarity is applied to the electric element.

Next, the results of experiments on sample (C) are described with reference to FIG. 6, FIG. 7A and FIG. 7B.

[Materials Used]

Upper electrode 1: Pt (thickness: about 0.2 μm, work function: 5.7 eV)

State-variable material layer 2: $CuFe_2O_4$ (thickness: about 0.1 μm)

Lower electrode 3: Pt (thickness: about 0.2 μm, work function: 5.7 eV)

<Experimental Results>

[Result of Experiment 1]

Experiment 1 was carried out on sample (C). The experimental result was as shown in FIG. 6. After the application of the positive (+) pulse voltage, the measured value changed from the high resistance state to the low resistance state. After the application of the negative (−) pulse voltage, the measured value changed from the low resistance state to the high resistance state. Thus, the resistance value for the direction extending from the upper electrode 1 to the lower electrode 3 (the resistance value of the state-variable material layer 2) increased or decreased according to the applied pulse voltage.

[Result of Experiment 2]

Experiment 2 was carried out on sample (C). The experimental result was as shown in FIG. 6. As seen from FIG. 6, the resistance value for the direction extending from the lower electrode 3 to the upper electrode 1 (the resistance value of the state-variable material layer 2) increased or decreased according to the applied pulse voltage.

[Result of Experiment 3]

Experiment 3 was carried out on sample (C). The current-voltage characteristic measured after the application of the positive (+) pulse voltage is shown in FIG. 7A, and the current-voltage characteristic measured after the application of the negative (−) pulse voltage is shown in FIG. 7B. Comparing FIG. 7A and FIG. 7B, it was found that the electric current readily flows (the resistance value of the state-variable material layer 2 is small) after the application of the positive (+) pulse voltage rather than after the application of the negative (−) pulse voltage.

[Verification Result]

From the above experiments, it was found that sample (C) exhibits the following characteristic.

(1) Characteristic such that the resistance value decreases in response to the application of the positive (+) pulse voltage but increases in response to the application of the negative (−) pulse voltage (variable-resistance characteristic).

<Conclusion>

In sample (A), the work function of the upper electrode 1 is smaller than that of the lower electrode 3. In sample (B), the work function of the upper electrode 1 is greater than that of the lower electrode 3. From the experimental results of sample (A), sample (B) and sample (C), it was found that the state-variable material layer 2 exhibits the following characteristics.

(1) Diode characteristic such that the direction extending from the electrode having a small work function to the electrode having a large work function is the forward direction, and the direction extending from the electrode having a large work function to the electrode having a small work function is the reverse direction.

(2) Characteristic such that the resistance value for the forward direction increases or decreases according to the applied pulse voltage (variable-resistance characteristic). Specifically, when a pulse voltage is applied between the upper electrode 1 and the lower electrode 3 such that the upper electrode 1 becomes positive (+) with respect to the lower electrode 3, the resistance value for the forward direction decreases. When a pulse voltage is applied between the upper electrode 1 and the lower electrode 3 such that the upper electrode 1 becomes negative (−) with respect to the lower electrode 3, the resistance value for the forward direction increases.

In sample (A), sample (B) and sample (C), a pulse voltage was applied to the state-variable material layer 2 after the formation of each sample such that the upper electrode 1 became positive (+) with respect to the lower electrode 3, whereby the resistance value of the state-variable material layer 2 was initially set to a resistance value which was lower than the resistance value measured immediately after the formation (about 1 MΩ) by about slightly more than one order of magnitude. Meanwhile, we also prepared sample (A'), sample (B') and sample (C'), which are the same as sample (A), sample (B) and sample (C), respectively, except that a pulse voltage (voltage value: −3 V, pulse width: 10 μsec) was applied to the state-variable material layer 2 after the formation of each sample such that the upper electrode 1 became negative (−) with respect to the lower electrode 3, whereby the resistance value of the state-variable material layer 2 was initially set to a resistance value which was lower than the resistance value measured immediately after the formation (about 1 MΩ) by about slightly more than one order of magnitude.

The above-described experiments performed on sample (A), sample (B) and sample (C) (experiments 1-3) were also carried out on sample (A'), sample (B') and sample (C').

<Experiments on Sample (A')>

Experiments on sample (A') are described with reference to FIG. 8A, FIG. 8B, FIG. 4A and FIG. 4B.

[Result of Experiment 1]

Figure 8A:
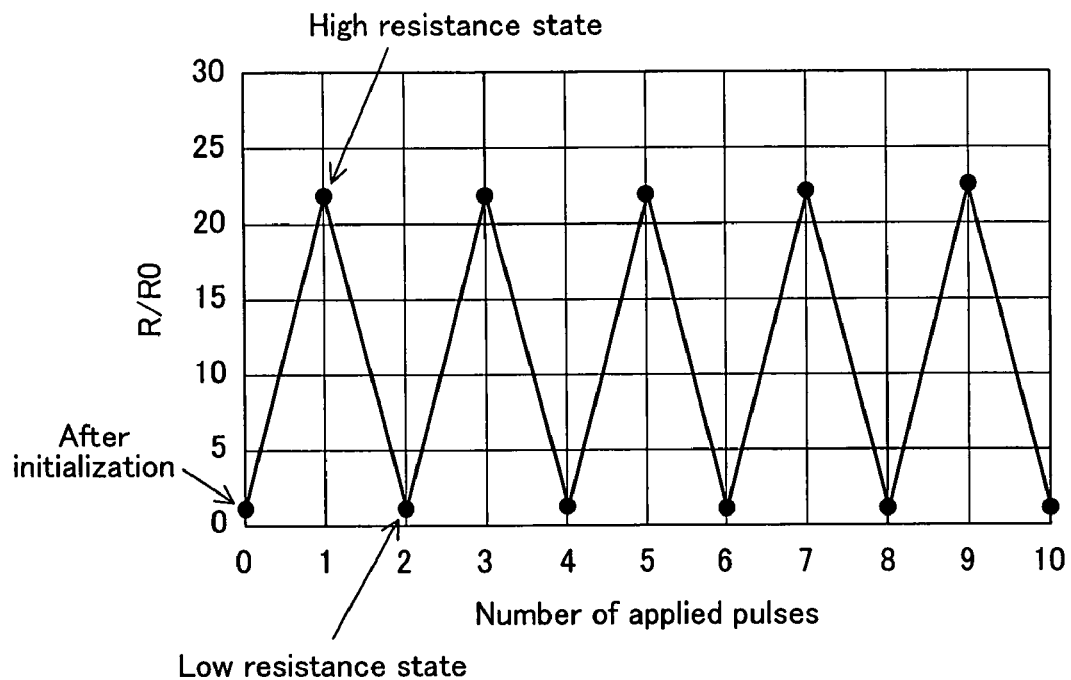
FIG. 8A shows a variation in resistance value which occurs due to pulse voltages of different polarities when a pulse voltage of the first polarity is applied to an electric element.

The result of experiment 1 on sample (A') was as shown in FIG. 8A. After the application of the positive (+) pulse voltage, the measured value changed from the low resistance state to the high resistance state. After the application of the negative (−) pulse voltage, the measured value changed from the high resistance state to the low resistance state. Thus, it was found that the resistance value for the direction extending from the upper electrode 1 to the lower electrode 3 (the resistance value of the state-variable material layer 2) increases or decreases according to the applied pulse voltage.

[Result of Experiment 2]

Figure 8B:
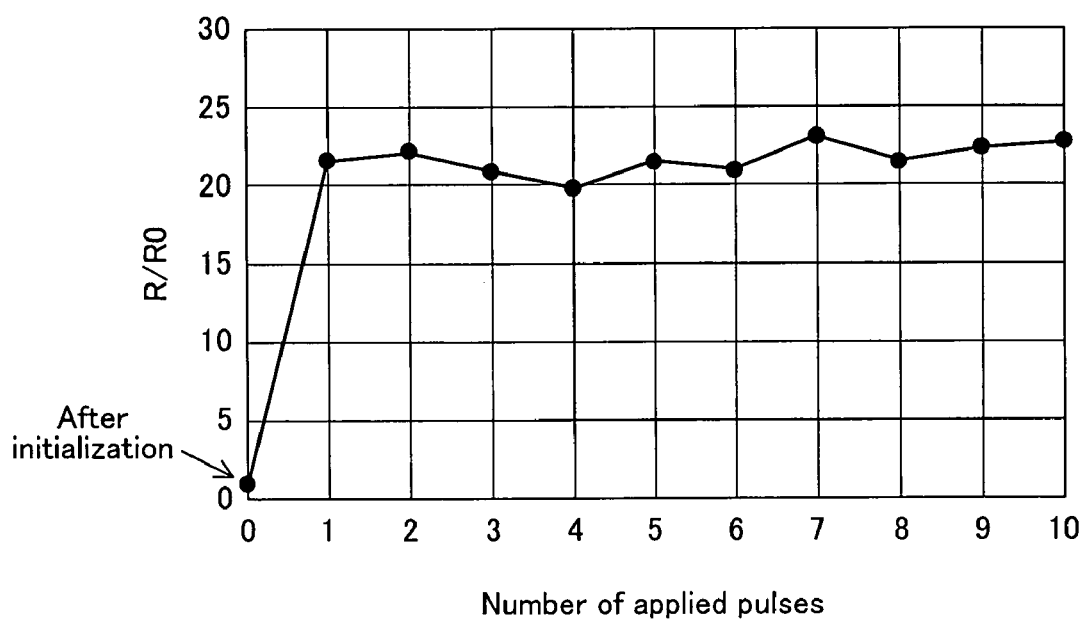
FIG. 8B shows a variation in resistance value which occurs due to pulse voltages of different polarities when a pulse voltage of the second polarity is applied to the electric element.

The result of experiment 2 on sample (A') was as shown in FIG. 8B. Even after the application of the negative (−) pulse voltage, the measured value was maintained at the high resistance state. Thus, it was found that the resistance value for the direction extending from the lower electrode 3 to the upper electrode 1 always exhibits the high resistance state irrespective of the applied pulse voltage.

[Result of Experiment 3]

The result of experiment 3 on sample (A') is now described. The current-voltage characteristic measured after the application of the positive (+) pulse voltage was as shown in FIG. 4B. The current-voltage characteristic measured after the application of the negative (−) pulse voltage was as shown in FIG. 4A.

<Experiments on Sample (B')>

The results of experiments on sample (B') are described with reference to FIG. 8A, FIG. 8B, FIG. 5A and FIG. 5B.

[Result of Experiment 1]

The result of experiment 1 on sample (B') was as shown in FIG. 8B. Thus, it was found that the resistance value for the direction extending from the upper electrode 1 to the lower electrode 3 always exhibits the high resistance state irrespective of the applied pulse voltage.

[Result of Experiment 2]

The result of experiment 2 on sample (B') was as shown in FIG. 8A. Thus, it was found that the resistance value for the direction extending from the lower electrode 3 to the upper electrode 1 increases or decreases according to the applied pulse voltage.

[Result of Experiment 3]

The result of experiment 3 on sample (B') is now described. The current-voltage characteristic measured after the application of the positive (+) pulse voltage was as shown in FIG. 5B. The current-voltage characteristic measured after the application of the negative (−) pulse voltage was as shown in FIG. 5A.

<Experiments on Sample (C')>

[Results of Experiment 1 and Experiment 2]

Figure 9:
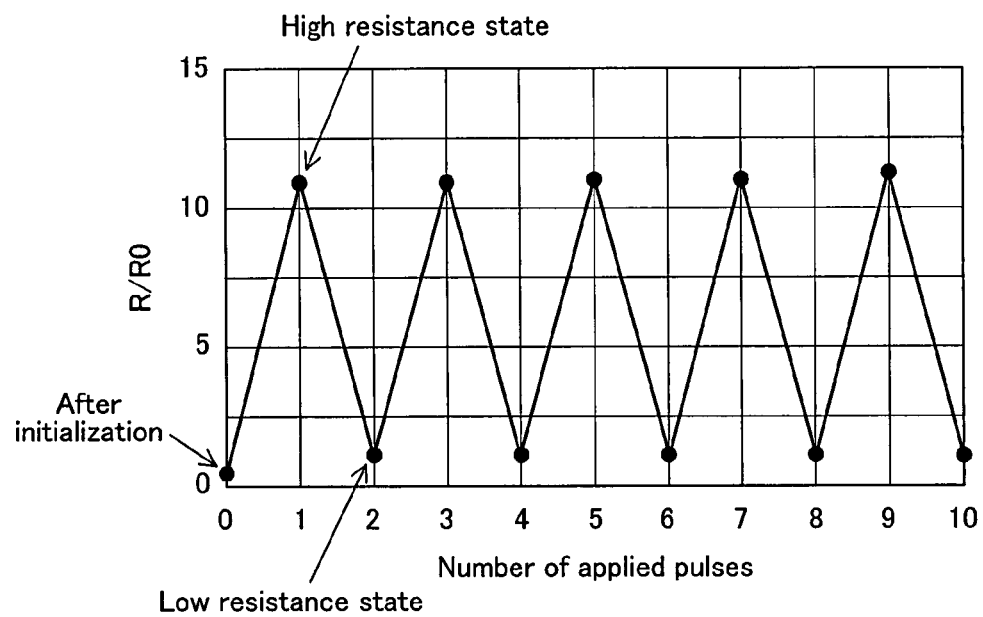
FIG. 9 shows a variation in resistance value which occurs when a pulse voltage is applied to an electric element.

The results of experiment 1 and experiment 2 on sample (C') were as shown in FIG. 9. Thus, it was found that both the resistance value for the direction extending from the upper electrode 1 to the lower electrode 3 and the resistance value for the direction extending from the lower electrode 3 to the upper electrode 1 increases or decreases according to the applied pulse voltage.

[Result of Experiment 3]

The result of experiment 3 on sample (C') is now described. The current-voltage characteristic measured after the application of the positive (+) pulse voltage was as shown in FIG. 7B. The current-voltage characteristic measured after the application of the negative (−) pulse voltage was as shown in FIG. 7A.

<Conclusion>

From the experimental results of sample (A'), sample (B') and sample (C'), it was found that the state-variable material layer 2 exhibits the following characteristics.

(1) Diode characteristic such that the direction extending from the electrode having a small work function to the electrode having a large work function is the forward direction, and the direction extending from the electrode having a large work function to the electrode having a small work function is the reverse direction.

(2) Characteristic such that the resistance value for the forward direction increases or decreases according to the applied pulse voltage (variable-resistance characteristic). Specifically, when a pulse voltage is applied between the upper electrode 1 and the lower electrode 3 such that the upper electrode 1 becomes positive (+) with respect to the lower electrode 3, the resistance value for the forward direction increases. When a pulse voltage is applied between the upper electrode 1 and the lower electrode 3 such that the upper electrode 1 becomes negative (−) with respect to the lower electrode 3, the resistance value for the forward direction decreases.

From the above-described experimental results of the above samples (samples (A) to (C) and samples (A') to (C')), it was found that the state-variable material layer 2 exhibits the following characteristics.

(1) Diode characteristic such that, where the work functions of the upper electrode 1 and the lower electrode 3 are different from each other, the direction extending from one electrode to the other electrode (first direction) is the forward direction, and the direction extending from the other electrode to the one electrode is the reverse direction (second direction, which is opposite to the first direction).

(2) Characteristic such that the resistance value for the forward direction of the diode characteristic increases or decreases when a predetermined pulse voltage is applied (variable-resistance characteristic).

Further, it was confirmed as to the pulse voltage applied for the purpose of changing the resistance value that the pulse width of the pulse voltage of example 1 (50 nsec) is shorter than the pulse width of the pulse voltage of the conventional example (1 μsec or longer).

Confirming the above-described characteristics, the electric element of FIG. 1 was produced using two types of materials having different work functions for the upper electrode 1 and the lower electrode 3.

EXAMPLE 2

To realize the state-variable material layer 2 having the above-described characteristics (variable-resistance characteristic and diode characteristic), a state-variable material which has nonuniform crystallinity is used for the state-variable material layer 2 in the electric element of FIG. 1. The reasons therefor are described below.

<Crystallinity of State-variable Material>

[State-variable Material Layer Formation Method 1]

The temperature of the substrate 4 on which the lower electrode 3 has been formed was increased to the vicinity of the crystallization temperature of a state-variable material used for the layer 2 (e.g., about 600° C. for $CuFe_2O_4$) to form the state-variable material layer 2. The thus-formed state-variable material layer 2 was subjected to an X-ray diffraction analysis to examine distortion of the crystalline structure, and as a result, it was found that the state-variable material layer 2 exhibits a sharp diffraction peak (a diffraction peak having a large intensity) at a position which indicates crystal interplanar spacing D. That is, it was found that the crystallinity of the thus-formed state-variable material layer 2 is basically uniform along the film thickness direction.

[State-variable Material Layer Formation Method 2]

The state-variable material layer 2 was formed while the temperature of the substrate 4 on which the lower electrode 3 has been formed was not increased to the vicinity of the crystallization temperature of a state-variable material used for the layer 2. The thus-formed state-variable material layer 2 was subjected to an X-ray diffraction analysis to examine distortion of the crystalline structure, and as a result, it was found that the crystalline structure of the state-variable material layer 2 has irregular interplanar spacings (i.e., the state-variable material layer 2 exhibits a broader diffraction peak having a small intensity). That is, it was found that the thus-formed state-variable material layer 2 has a distortion of the crystalline structure.

[State-variable Material Layer Formation Method 3]

The state-variable material layer 2 was formed while the temperature of the substrate 4 on which the lower electrode 3 has been formed was gradually decreased from about 600° C. Then, the upper electrode 1 was formed on the state-variable material layer 2. The thus-formed state-variable material layer 2 was subjected to an electron diffraction analysis with a transmission electron microscope. As a result, an electron diffraction pattern (a spot pattern at a certain cycle) which shows an excellent crystallinity was observed in a portion of the state-variable material layer 2 in the vicinity of the lower electrode 3, whereas an electron diffraction pattern (halo pattern) which shows a poor crystallinity (near amorphous) was observed in a portion of the state-variable material layer 2 in the vicinity of the upper electrode 1. That is, in the state-variable material layer 2, the crystal interplanar spacing exhibited a substantially-uniform value in the vicinity of the lower electrode 3. Thus, it was found that the state-variable material layer 2 has an excellent crystallinity with a small distortion of the crystalline structure in the vicinity of the lower electrode 3. On the other hand, in the vicinity of the upper electrode 1, the state-variable material layer 2 exhibited a distribution in which the crystal interplanar spacing was irregular as compared with the vicinity of the lower electrode 3. Thus, it was found that the state-variable material layer 2 has a poor crystallinity with a large distortion of the crystalline structure in the vicinity of the upper electrode 1.

Further, the state-variable material layer 2 was subjected to a cross-sectional TEM observation with a transmission electron microscope to measure the grain size of the state-variable material layer 2. The grain size of the state-variable material layer 2 in the vicinity of the lower electrode 3 was twice or more as large as that of the state-variable material layer 2 in the vicinity of the upper electrode 1. Therefore, it was confirmed that the state-variable material layer 2 has an excellent crystallinity in the vicinity of the lower electrode 3 rather than in the vicinity of the upper electrode 1.

From the above, it was found that, when the state-variable material layer 2 is formed while the temperature of the substrate 4 on which the lower electrode 3 has been formed is gradually decreased from about 600° C., the state-variable material layer 2 results in nonuniform crystallinity in which the crystallinity is excellent in the vicinity of the lower electrode 3 but poor in the vicinity of the upper electrode 1 (namely, the uniformity in crystallinity of the state-variable material layer 2 decreases along the thickness from the lower electrode 3 to the upper electrode 1).

<Experiment on Sample (D)>

The state-variable material layer 2 was formed on the lower electrode 3 according to the above-described state-variable material layer formation method 3, and the upper electrode 1 was formed on the state-variable material layer 2, whereby sample (D) was produced.

[Sample (D)]

Upper electrode 1: Pt (thickness: about 0.2 μm, work function: 5.7 eV)

State-variable material layer 2: $CuFe_2O_4$ (thickness: about 0.1 μm)

Lower electrode 3: Pt (thickness: about 0.2 μm, work function: 5.7 eV)

It should be noted that, after the formation of sample (D), a pulse voltage (voltage value: +3 V, pulse width: 10 μsec) was applied to the state-variable material layer 2 such that the upper electrode 1 became positive (+) with respect to the lower electrode 3, whereby the resistance value of the state-variable material layer 2 was initialized to a resistance value which was lower than the resistance value measured immediately after the formation (about 1 MΩ) by about slightly more than one order of magnitude.

[Experiments 1-3]

The above-described experiments of example 1 (experiments 1-3) were performed on sample (D). The results thereof were the same as those of sample (A) of example 1 (see FIG. 3A, FIG. 3B, FIG. 4A and FIG. 4B). From the experimental result of sample (D), it was found that the state-variable material layer 2 exhibits the following characteristics.

(1) Diode characteristic such that the direction extending from the poor crystallinity region to the excellent crystallinity region is the forward direction, and the direction extending from the excellent crystallinity region to the poor crystallinity region is the reverse direction.

(2) Characteristic such that the resistance value for the forward direction increases or decreases according to the applied pulse voltage (variable-resistance characteristic). Specifically, when a pulse voltage is applied between the upper electrode 1 and the lower electrode 3 such that the upper electrode 1 becomes positive (+) with respect to the lower electrode 3, the resistance value for the forward direction decreases. When a pulse voltage is applied between the upper electrode 1 and the lower electrode 3 such that the upper electrode 1 becomes negative (−) with respect to the lower electrode 3, the resistance value for the forward direction increases.

Meanwhile, we also prepared sample (D'), which is the same as sample (D) except that a pulse voltage (voltage value: −3 V, pulse width: 10 μsec) was applied to the state-variable material layer 2 after the formation of the sample such that the upper electrode 1 became negative (−) with respect to the lower electrode 3, whereby the resistance value of the state-variable material layer 2 was initialized to a resistance value which was lower than the resistance value measured immediately after the formation (about 1 MΩ) by about slightly more than one order of magnitude.

The above-described experiments performed on sample (D) (experiments 1-3) are also carried out on sample (D').

<Experiments on Sample (D')>

The result of experiment 1 on sample (D') was as shown in FIG. 8A. The result of experiment 2 on sample (D') was as shown in FIG. 8B. Further, it was confirmed that the result of experiment 3 on sample (D') (current-voltage characteristic) was as shown in FIG. 4B after the application of the positive (+) pulse voltage but was as shown in FIG. 4A after the application of the negative (−) pulse voltage. From the experimental results of sample (D'), it was found that the state-variable material layer 2 exhibits the following characteristics.

(1) Diode characteristic such that the direction extending from the poor crystallinity region to the excellent crystallinity region is the forward direction, and the direction extending from the excellent crystallinity region to the poor crystallinity region is the reverse direction.

(2) Characteristic such that the resistance value for the forward direction increases or decreases according to the applied pulse voltage (variable-resistance characteristic). Specifically, when a pulse voltage is applied between the upper electrode 1 and the lower electrode 3 such that the upper electrode 1 becomes positive (+) with respect to the lower electrode 3, the resistance value for the forward direction increases. When a pulse voltage is applied between the upper electrode 1 and the lower electrode 3 such that the upper electrode 1 becomes negative (−) with respect to the lower electrode 3, the resistance value for the forward direction decreases.

From the above-described experimental results of the above samples (sample (D) and sample (D')), it was found that the state-variable material layer 2 exhibits the following characteristics.

(1) Diode characteristic such that, where the crystallinity of the state-variable material layer 2 is not uniform, the direction extending from one electrode to the other electrode (first direction) is the forward direction, and the direction extending from the other electrode to the one electrode is the reverse direction (second direction, which is opposite to the first direction).

(2) Characteristic such that the resistance value for the forward direction of the diode characteristic is increased or decreased when a predetermined pulse voltage is applied (variable-resistance characteristic).

Further, it was confirmed as to the pulse voltage applied for the purpose of changing the resistance value that the pulse width of the pulse voltage of example 2 (50 nsec) is shorter than the pulse width of the pulse voltage of the conventional example (1 μsec or longer).

Confirming the above-described characteristics, the electric element of FIG. 1 was produced using a state-variable material of nonuniform crystallinity for the state-variable material layer 2.

In example 1 and example 2, $CuFe_2O_4$, which is a metal oxide material of a spinel structure, was used for the state-variable material layer 2, but the present invention is not limited thereto. We confirmed that the above-described characteristics can be realized with any of another metal oxide material having a spinel structure, a ferroelectric oxide including an ilmenite structure metal added thereto, a perovskite-structured CMR material and a perovskite-structured high-temperature superconductor material. Specifically, it was confirmed that the above-described characteristics can be realized with, for example, $CoFe_2O_4$, $NiCr_2O_4$, $Fe_3O_4$, Cr—$SrTiO_3$, Sr—$LiNbO_3$, Mg—$LiNbO_3$, $Pr_{(1-X)}Ca_XMnO_3$, $LaSrMnO_3$, or $GdBaCo_XO_Y$.

Other electrode materials may be used for the upper electrode 1 and the lower electrode 3.

EMBODIMENT 1

<Definition of Graphical Symbol>

Figure 10:
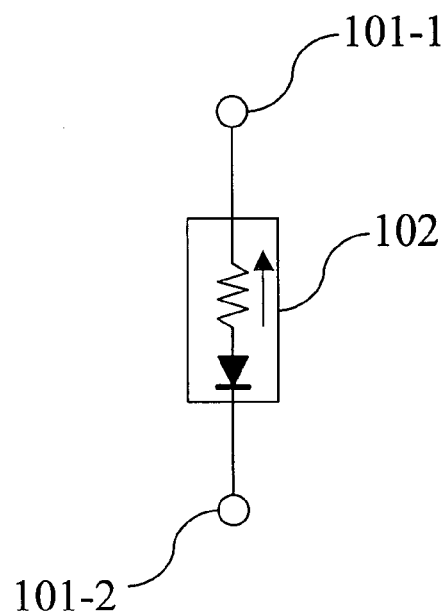
FIG. 10 shows a graphical symbol of an electric element.

An electric element of embodiment 1 of the present invention is described. We define the graphical symbol of the electric element of embodiment 1 as shown in FIG. 10. In the electric element 102 shown in FIG. 10, when a pulse voltage is applied between a terminal 101-1 and a terminal 101-2 such that the terminal 101-1 becomes positive (+) with respect to the terminal 101-2, the resistance value of the electric element 102 decreases. When a pulse voltage is applied between the terminal 101-1 and the terminal 101-2 such that the terminal 101-1 becomes negative (−) with respect to the terminal 101-2, the resistance value of the electric element 102 increases. Further, the electric element 102 shown in FIG. 10 exhibits a diode characteristic such that the direction extending from the terminal 101-1 to the terminal 101-2 is "forward direction" and the direction extending from the terminal 101-2 to the terminal 101-1 is "reverse direction".

<Operation>

Next, the operation of the electric element 102 shown in FIG. 10 is described. Herein, the electric element 102 is used as a memory to perform a process of 1-bit data. It is assumed that the resistance value of the electric element 102 (the resistance value of the state-variable material layer 2) is initialized to a high resistance state. It is further assumed that when the resistance value of the electric element 102 is at "high resistance state", the logical value is "0". When the resistance value of the electric element 102 is at "low resistance state", the logical value is "1".

[Memorization]

To write 1-bit data representing "1" in the electric element 102, the terminal 101-2 is pulled down to the ground, and a memorization voltage is applied to the terminal 101-1. The memorization voltage is, for example, a pulse voltage (positive (+) pulse voltage) which has a voltage value of +3 V and a pulse width of 50 nsec. Since the positive (+) pulse voltage is applied to the electric element 102, the resistance value of the electric element 102 (the resistance value of the state-variable material) results in the low resistance state. In this way, 1-bit data representing "1" is stored in the electric element 102.

[Reset]

To reset the memory state of the electric element 102 to the initial state, the terminal 101-2 is pulled down to the ground, and a reset voltage is applied to the terminal 101-1. The reset voltage is, for example, a pulse voltage (negative (−) pulse voltage) which has a voltage value of −3 V and a pulse width of 50 nsec. Since the negative (−) pulse voltage is applied to the electric element 102, the resistance value of the electric element 102 returns to the high resistance state. In this way, the memory state of the electric element 102 is returned to the initial state.

[Reproduction]

To read data from the electric element 102, the terminal 101-2 is pulled down to the ground, and a reproduction voltage is applied to the terminal 101-1. The reproduction voltage is, for example, a voltage which has a voltage value of +0.5 V. Since the reproduction voltage (=positive (+) measurement voltage) is applied to the electric element 102, an electric current which has an electric value determined according to the resistance value of the electric element 102 flows from the terminal 101-1 to the terminal 101-2 (forward direction). Assuming herein that an electric current which flows when the resistance value of the electric element 102 exhibits "high resistance state" corresponds to "0" and an electric current which flows when the resistance value of the electric element 102 exhibits "low resistance state" corresponds to "1", the above current flow means reproduction of 1-bit data memorized in the electric element 102.

Thus, as described above, the electric element 102 can be used as a memory.

<Effects>

As described above, since the electric element has the "diode characteristic", the direction of the electric current can be defined without using a diode element therefor. Further, the electric element has the "variable-resistance characteristic" and therefore can be used as, for example, a 1D1R nonvolatile memory. In such a use, it is not necessary to provide a diode, and therefore, the production process is simplified, as compared with a conventional 1D1R nonvolatile memory.

Since a diode is not provided, the polarity of a pulse voltage to be applied to the variable-resistance material is not restricted. Therefore, both a pulse voltage of positive (+) polarity and a pulse voltage of negative (−) polarity can be applied to the state-variable material layer. In such a pulse application method (wherein the resistance value is changed according to the polarity of the pulse voltage), the pulse width of a pulse voltage applied is short (50 nsec in embodiment 1) as compared with a conventional pulse application method (wherein the resistance value of the variable-resistance material is changed by adjusting the pulse width of the pulse voltage). That is, the time required for memorization or reset can be shortened.

According to embodiment 1, the above-described effects can also be achieved when any of the following materials is used for the state-variable material layer 2 of the electric element 102: $CuFe_2O_4$, $CoFe_2O_4$, $NiCr_2O_4$, and $Fe_3O_4$, which have a spinel structure, a ferroelectric oxide including an ilmenite structure metal added thereto, a perovskite-structured CMR material, a perovskite-structured high-temperature superconductor material, etc. Specifically, the above-described effects can also be achieved with Cr—SrTiO$_3$, Sr—LiNbO$_3$, Mg—LiNbO$_3$, Pr$_{(1-X)}$Ca$_X$MnO$_3$, LaSrMnO$_3$, GdBaCo$_X$O$_Y$, or the like.

In CMOS process, it is desirable that the film formation temperature is 450° C. or lower for the purpose of avoiding a high-temperature collapse, or the like. To form a film of a perovskite-structured material, it is in general necessary to set the substrate temperature at 700° C. or higher. On the other hand, to form a film of a spinel structure material, a substrate temperature of about 400° C. is sufficient. Thus, when a spinel structure material is used for the state-variable material layer 2 of FIG. 1, the film formation temperature can be set at a low temperature. Therefore, a spinel structure material has better conformity to the semiconductor process than a perovskite-structured material.

In general, the high-temperature superconductor material and the CMR material are oxides containing an alkali metal and/or alkaline-earth metal. When the electric element of FIG. 1 is formed using such a material, an alkali metal and/or alkaline-earth metal dissolved out at a washing step of the semiconductor process, and therefore, the characteristics of the electric element as a memory device are deteriorated. To prevent the characteristic deterioration, it is preferable that a material not containing an alkali metal or alkaline-earth metal is used for the state-variable material layer 2.

In embodiment 1, 1-bit data is represented by the two different states, the high resistance state and the low resistance state, whereby the electric element is used as a memory. However, the electric element may be used as a nonvolatile memory device wherein the width and amplitude of an electric pulse are changed to create 4 or more resistance states, whereby 2-bit or 3 or more-bit information is stored.

EMBODIMENT 2

<General Structure>

Figure 11:
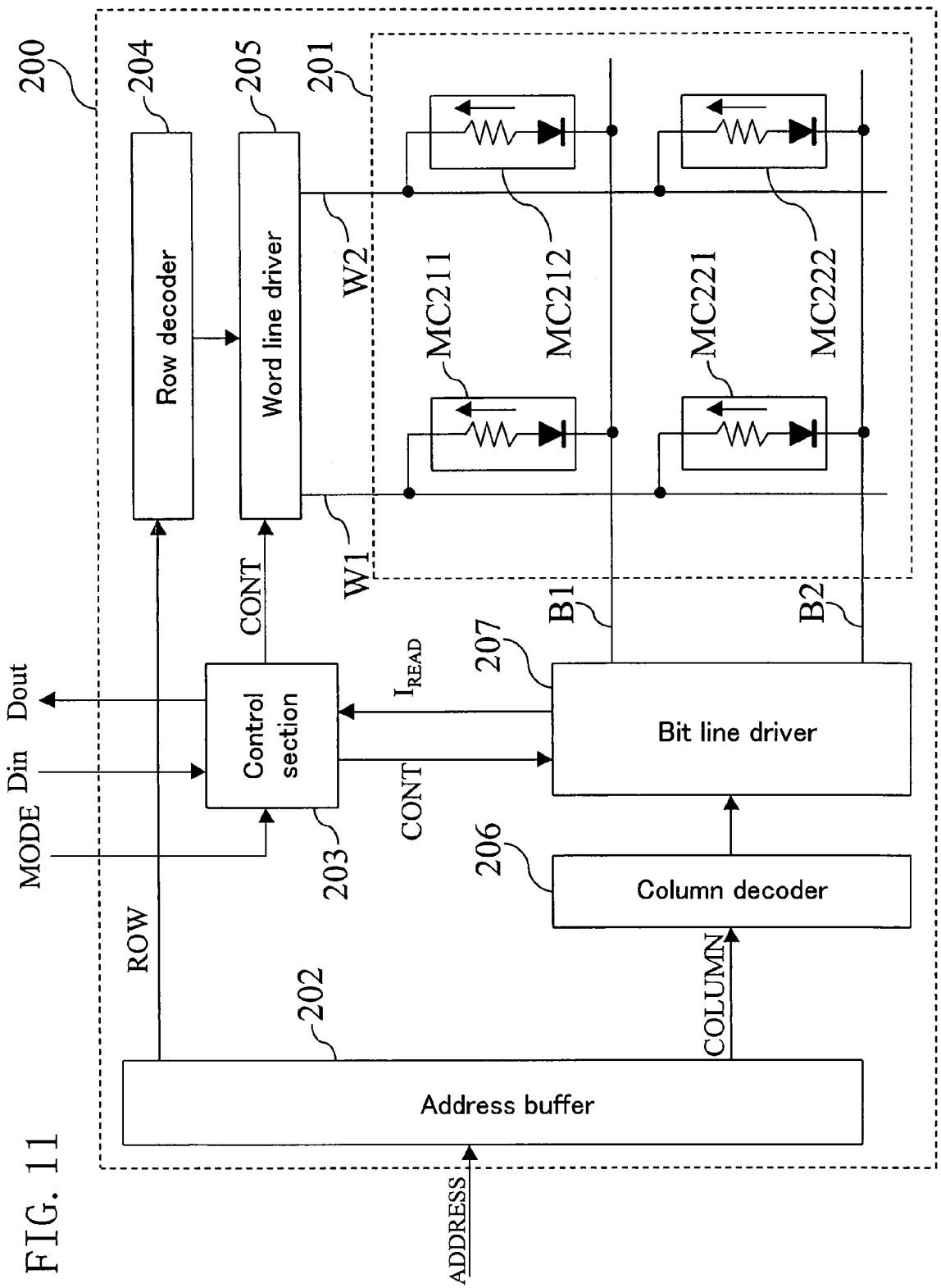
FIG. 11 shows a general structure of a memory device according to embodiment 2 of the present invention.

The general structure of a memory device 200 according to embodiment 2 of the present invention is shown in FIG. 11. The memory device 200 includes a memory array 201, an address buffer 202, a control section 203, a row decoder 204, a word line driver 205, a column decoder 206, and a bit line driver 207.

The memory array 201 includes word lines W1 and W2, bit lines B1 and B2, and memory cells MC211, MC212, MC221 and MC222. Each of the memory cells MC211, MC212, MC221 and MC222 is the electric element 102 shown in FIG. 10. One end of the memory cell MC211 is connected to the word line W1, and the other end of the memory cell MC211 is connected to the bit line B1 (forward direction: W1→B1). One end of the memory cell MC212 is connected to the word line W2, and the other end of the memory cell MC212 is connected to the bit line B1 (forward direction: W2→B1). One end of the memory cell MC221 is connected to the word line W1, and the other end of the memory cell MC221 is connected to the bit line B2 (forward direction: W1→B2). One end of the memory cell MC222 is connected to the word line W2, and the other end of the memory cell MC222 is connected to the bit line B2 (forward direction: W2→B2).

The address buffer 202 receives address signal ADDRESS supplied from the outside of the memory device 200 to output row address signal ROW to the row decoder 204 and output column address signal COLUMN to the column decoder 206. Address signal ADDRESS indicates an address of a memory cell selected from the memory cells MC211, MC212, MC221 and MC222. Row address signal ROW indicates the row address of the address indicated by address signal ADDRESS. Column address signal COLUMN indicates the column address of the address indicated by address signal ADDRESS.

The control section 203 enters any one of memorization mode, reset mode, and reproduction mode according to mode selection signal MODE supplied from the outside of the memory device 200. In the memorization mode, the control section 203 outputs a control signal CONT which indicates "application of memorization voltage" to the word line driver 205 and the bit line driver 207 according to input data Din supplied from the outside of the memory device 200. In the reproduction mode, the control section 203 outputs a control signal CONT which indicates "application of reproduction voltage" to the word line driver 205 and the bit line driver 207. In the reproduction mode, the control section 203 outputs output data Dout indicative of a bit value which is determined according to signal I$_{READ}$ received from the bit line driver 207 to an external device. Signal I$_{READ}$ indicates the current value of an electric current flowing through the bit line B1 or B2. In the reset mode, the control section 203 checks the memory state of the memory cells MC211, MC212, MC221 and MC222 and outputs a control signal CONT which indicates "application of reset voltage" to the word line driver 205 and the bit line driver 207 according to the checked memory state.

The row decoder 204 selects any one of the word lines W1 and W2 according to row address signal ROW received from the address buffer 202.

When receiving the control signal CONT which indicates "application of memorization voltage" from the control section 203, the word line driver 205 applies memorization voltage V1$_{WRITE}$ to a word line selected by the row decoder 204. When receiving the control signal CONT which indicates "application of reproduction voltage" from the control section 203, the word line driver 205 applies reproduction voltage V1$_{READ}$ to a word line selected by the row decoder 204. When receiving the control signal CONT which indicates "application of reset voltage" from the control section 203, the word line driver 205 applies reset voltage V1$_{RESET}$ to a word line selected by the row decoder 204.

The column decoder 206 selects any one of the bit lines B1 and B2 according to column address signal COLUMN received from the address buffer 202.

When receiving the control signal CONT which indicates "application of memorization voltage" from the control section 203, the bit line driver 207 applies memorization voltage V2$_{WRITE}$ to a word line selected by the column decoder 206. When receiving the control signal CONT which indicates "application of reproduction voltage" from the control section 203, the bit line driver 207 applies reproduction voltage V2$_{READ}$ to the bit line which is not selected by the column decoder 206 and then outputs to the control section 203 signal I$_{READ}$ which indicates the current value of an electric current flowing through the bit line B1 or B2. When receiving the control signal CONT which indicates "application of reset voltage" from the control section 203, the bit line driver 207 applies reset voltage V2$_{RESET}$ to a bit line selected by the column decoder 206.

Memorization voltage V1$_{WRITE}$ is, for example, a pulse voltage which has a voltage value of +1.5 V and a pulse width of 50 nsec. Memorization voltage V2$_{WRITE}$ is, for example, a pulse voltage which has a voltage value of −1.5 V and a pulse width of 50 nsec. Herein, the potential difference between memorization voltage V1$_{WRITE}$ and memorization voltage V2$_{WRITE}$ is 3 V.

Reproduction voltage V1$_{READ}$ and reproduction voltage V2$_{READ}$ have, for example, a voltage value of +0.5 V. Herein, reproduction voltage $V1_{READ}$ and reproduction voltage $V2_{READ}$ are equal to each other.

Reset voltage $V1_{RESET}$ is, for example, a pulse voltage which has a voltage value of −1.5 V and a pulse width of 50 nsec. Reset voltage $V2_{RESET}$ is, for example, a pulse voltage which has a voltage value of +1.5 V and a pulse width of 50 nsec. Herein, the potential difference between reset voltage $V1_{RESET}$ and reset voltage $V2_{RESET}$ is 3 V.

<Operation>

Next, an operation of the memory device 200 shown in FIG. 11 is described. The operation modes of the memory device 200 include the memorization mode where input data Din is written in a memory cell, the reset mode where information written in a memory cell is reset, and the reproduction mode where information written in a memory cell is output (reproduced) as output data Dout. It is assumed herein that the memory cells MC211, MC212, MC221 and MC222 are initialized to the high resistance state. It is further assumed that address signal ADDRESS indicates the address of the memory cell MC211.

[Memorization Mode]

In the first place, the operation in the memorization mode is described.

When input data Din represents "1", the control section 203 outputs a control signal CONT which indicates "application of memorization voltage" to the word line driver 205 and the bit line driver 207. When input data Din represents "0", the control section 203 does not output a control signal CONT.

Receiving the control signal CONT which indicates "application of memorization voltage" from the control section 203, the bit line driver 207 applies memorization voltage $V2_{WRITE}$ to the bit line B1 selected by the column decoder 206 and pulls the other bit line B2 (unselected bit line) down to the ground.

In the meantime, receiving the control signal CONT which indicates "application of memorization voltage" from the control section 203, the word line driver 205 applies memorization voltage $V1_{WRITE}$ to a word line selected by the row decoder 204 and pulls the other word line W2 (unselected word line) down to the ground.

Since in the memory cell MC211 a pulse voltage (positive (+) pulse voltage) which has a voltage value of +3 V and a pulse width of 50 nsec has been applied, the resistance value of the memory cell MC211 results in the low resistance state.

Although in the memory cell MC212 a pulse voltage (negative (−) pulse voltage) which has a voltage value of −1.5 V and a pulse width of 50 nsec has been applied, the resistance state of the memory cell MC212 does not change because the voltage value of the applied pulse voltage is short of a predetermined level (herein "−3 V").

Although in the memory cell MC221 a pulse voltage (positive (+) pulse voltage) which has a voltage value of +1.5 V and a pulse width of 50 nsec has been applied, the resistance state of the memory cell MC221 does not change because the voltage value of the applied pulse voltage is short of a predetermined level (herein "+3 V").

Since the potential different between the ends of the memory cell MC222 is 0 V, the resistance state of the memory cell MC222 does not change.

Thus, since only the resistance state of the memory cell MC211 changes to the "low resistance state", 1-bit data representing "1" is written in the memory cell MC211.

After the writing of data in the memory cell MC211 has been completed, new address signal ADDRESS is input to the address buffer 202, and the above-described operation in the memorization mode is repeated.

[Reproduction Mode]

Next, the operation in the reproduction mode is described.

The control section 203 outputs a control signal CONT which indicates "application of reproduction voltage" to the word line driver 205 and the bit line driver 207.

Receiving the control signal CONT which indicates "application of reproduction voltage" from the control section 203, the bit line driver 207 applies reproduction voltage $V2_{READ}$ to the bit line B2 which is not selected by the column decoder 206 and pulls the other bit line B1 (selected bit line) down to the ground.

In the meantime, receiving the control signal CONT which indicates "application of reproduction voltage" from the control section 203, the word line driver 205 applies reproduction voltage $V1_{READ}$ to a word line selected by the row decoder 204 and pulls the other word line W2 (unselected word line) down to the ground.

Since in the memory cell MC211 a positive (+) measurement voltage has been applied, an electric current having a current value determined according to the resistance value of the memory cell MC211 flows through the memory cell MC211 and then comes into the bit line B1.

Since the potential different between the ends of the memory cell MC212 is 0 V, no electric current flows through the memory cell MC212. Since in the memory cell MC212 the direction extending from the bit line B1 to the word line W2 is "reverse direction", there is no possibility that the electric current flowing through the bit line B1 flows into the word line W2.

Since the potential different between the ends of the memory cell MC221 is 0 V, no electric current flows through the memory cell MC221.

Since in the memory cell MC222 a negative (−) measurement voltage has been applied, no electric current flows through the memory cell MC222.

Then, the bit line driver 207 measures the current value of an electric current flowing through the bit line B1 or B2 and outputs to the control section 203 signal $I_{READ}$ which indicates the measured current value. The control section 203 then outputs output data Dout which is determined according to the current value indicated by signal $I_{READ}$ to an external device. For example, if the measured current value is a current value of an electric current which flows in the case of the low resistance state, output data Dout which is output from the control section 203 represents "1".

Thus, since an electric current flows only through the memory cell MC211 and the electric current flowing through the memory cell MC211 comes into the bit line B1, 1-bit data is read from the memory cell MC211.

After the reading of data from the memory cell MC211 has been completed, new address signal ADDRESS is input to the address buffer 202, and the above-described operation in the reproduction mode is repeated.

[Reset Mode]

Next, the operation in the reset mode is described.

The control section 203 checks the memory state of the memory cell MC211 through the process of the reproduction mode.

In the case where the control section 203 determines that the memory cell MC211 stores bit data representing "1" (the memory cell MC211 is at the low resistance state), the control section 203 outputs a control signal CONT which indicates "application of reset voltage" to the word line driver 205 and the bit line driver 207. In the case where the memory cell MC211 stores bit data representing "0" (the memory cell MC211 is at the high resistance state), the control section 203 does not output a control signal CONT.

Receiving the control signal CONT which indicates "application of reset voltage" from the control section 203, the bit line driver 207 applies reset voltage $V2_{RESET}$ to a bit line B1 selected by the column decoder 206 and pulls the other bit line B2 (unselected bit line) down to the ground.

In the meantime, receiving the control signal CONT which indicates "application of reset voltage" from the control section 203, the word line driver 205 applies reset voltage $V1_{RESET}$ to a word line selected by the row decoder 204 and pulls the other word line W2 (unselected word line) down to the ground.

Since in the memory cell MC211 a pulse voltage (negative (−) pulse voltage) which has a voltage value of −3 V and a pulse width of 50 nsec has been applied, the resistance value of the memory cell MC211 results in the high resistance state.

Although in the memory cell MC212 a pulse voltage (positive (+) pulse voltage) which has a voltage value of +1.5 V and a pulse width of 50 nsec has been applied, the resistance state of the memory cell MC212 does not change because the voltage value of the applied pulse voltage is short of a predetermined level (herein "+3 V").

Although in the memory cell MC221 a pulse voltage (negative (−) pulse voltage) which has a voltage value of −1.5 V and a pulse width of 50 nsec has been applied, the resistance state of the memory cell MC221 does not change because the voltage value of the applied pulse voltage is short of a predetermined level (herein "−3 V").

Since the potential different between the ends of the memory cell MC222 is 0 V, the resistance state of the memory cell MC222 does not change.

Thus, since only the resistance state of the memory cell MC211 changes to the "high resistance state", 1-bit data stored in the memory cell MC211 is reset.

After the resetting of the memory cell MC211 has been completed, new address signal ADDRESS is input to the address buffer 202, and the above-described operation in the reset mode is repeated.

<Effects>

As described above, since the electric element (memory cell) has the "diode characteristic", no electric current flows from a word line to another word line. Thus, a memory device can be produced without additionally providing a diode element, and therefore, the production process can be simplified.

According to embodiment 2, a predetermined pulse voltage is applied to an electric element in which information is to be stored, while the predetermined pulse voltage is not applied to the other electric elements. As a result, only the resistance state of the electric element in which information is to be stored can be changed. That is, it is possible to arbitrarily select an electric element and store information in the selected electric element.

According to embodiment 2, in an electric element from which information is to be read, an electric current flows in the forward direction, while no electric current flows in the forward direction in the other electric elements. Thus, it is possible to read only the electric current flowing through the electric element from which information is to be read. That is, it is possible to arbitrarily select an electric element and read information stored in the selected electric element.

FIG. 11 shows only four memory cells but the present invention is not limited thereto. For example, 5 or more memory cells may be arranged in a matrix.

EMBODIMENT 3

<Structure>

Figure 12:
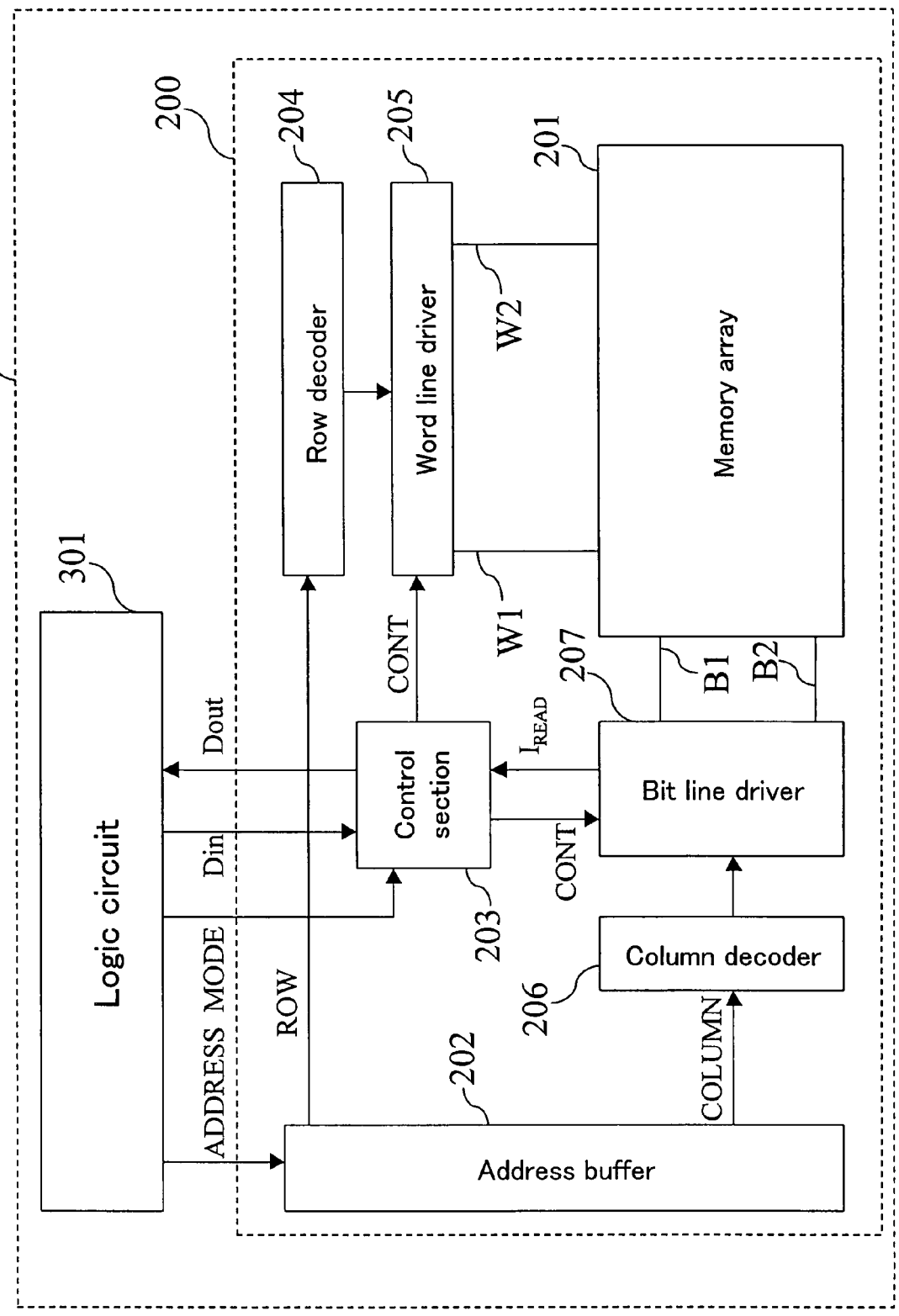
FIG. 12 shows a general structure of a semiconductor integrated circuit according to embodiment 3 of the present invention.

The structure of a semiconductor integrated circuit (Embedded-RAM) 300 according to embodiment 3 of the present invention is shown in FIG. 12. The circuit 300 includes the memory device 200 shown in FIG. 11 and a logic circuit 301 and is formed as a single semiconductor chip. The memory device 200 shown in FIG. 11 is used as a data RAM. The logic circuit 301 is a circuit which performs a predetermined operation (e.g., encoding or decoding of sound data or image data) and uses the memory device 200 in the operation. The logic circuit 301 controls address signal ADDRESS and mode selection signal MODE which are supplied to the memory device 200 to write data in or read data from the memory device 200.

<Operation>

Next, the operation of the semiconductor integrated circuit (Embedded-RAM) 300 shown in FIG. 12 is described. The operation of the circuit 300 includes a write process for writing predetermined data (bit data) in the memory device 200, a read process for reading data written in the memory device 200, and a reset process for resetting data written in the memory device 200.

[Write Process]

In the first place, the write process is described.

To write predetermined data (for example, encoded moving picture data, or the like) in the memory device 200, the logic circuit 301 outputs a mode selection signal MODE which indicates "memorization mode" to the control section 203 of the memory device 200.

Then, to select memory cells in which the predetermined data is to be written, the logic circuit 301 sequentially outputs address signals ADDRESS to the address buffer 202 of the memory device 200. As a result, in the memory device 200, memory cells are sequentially selected according to address signals ADDRESS.

Then, the logic circuit 301 outputs the predetermined data on a bit-by-bit basis as 1-bit data Din to the control section 203 of the memory device 200.

Then, in the memory device 200, the same operation as that of the memorization mode of embodiment 2 is performed. As a result, the predetermined data is written in the memory device 200 on a bit-by-bit basis.

[Read Process]

Next, the read process is described.

To read data written in the memory device 200, the logic circuit 301 outputs a mode selection signal MODE which indicates "reproduction mode" to the control section 203 of the memory device 200.

Then, to select memory cells from which written data is to be read, the logic circuit 301 sequentially outputs address signals ADDRESS to the address buffer 202 of the memory device 200. As a result, in the memory device 200, memory cells are sequentially selected according to address signals ADDRESS.

Then, in the memory device 200, the same operation as that of the reproduction mode of embodiment 2 is performed. As a result, the data stored in the memory device 200 is read on a bit-by-bit basis as output data Dout.

[Reset Process]

Next, the reset process is described.

To reset data written in the memory device 200, the logic circuit 301 outputs a mode selection signal MODE which indicates "reset mode" to the control section 203 of the memory device 200.

Then, to select memory cells in which stored data is to be reset, the logic circuit 301 sequentially outputs address signals ADDRESS to the address buffer 202 of the memory device 200. As a result, in the memory device 200, memory cells are sequentially selected according to address signals ADDRESS.

Then, in the memory device 200, the same operation as that of the reset mode of embodiment 2 is performed. As a result, the data stored in the memory device 200 is reset on a bit-by-bit basis.

<Effects>

As described above, a large amount of information can be stored quickly in the memory device 200.

EMBODIMENT 4

<Structure>

Figure 13:
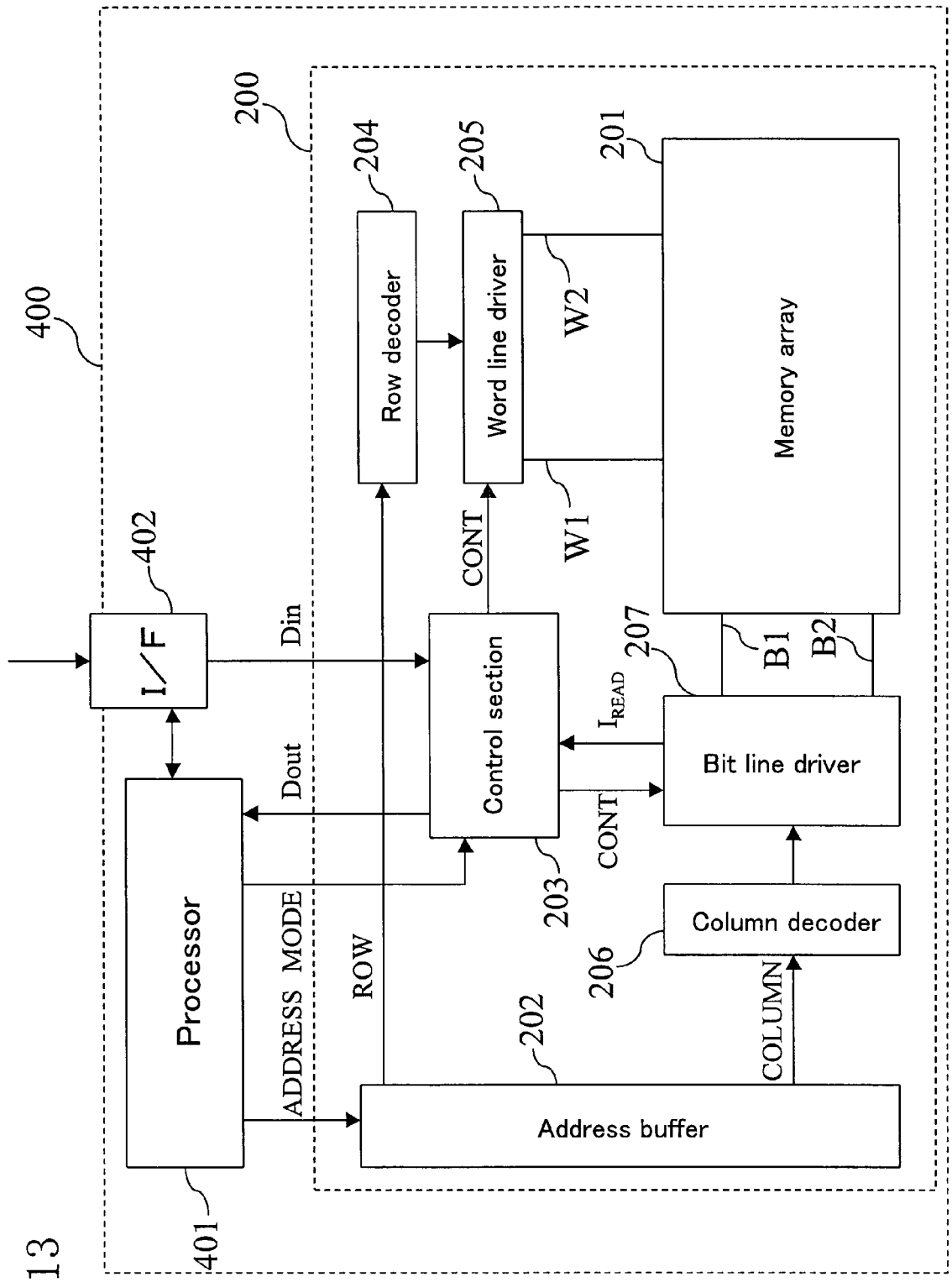
FIG. 13 shows a general structure of a semiconductor integrated circuit according to embodiment 4 of the present invention.

The structure of a semiconductor integrated circuit (reconfigurable LSI) 400 according to embodiment 4 of the present invention is shown in FIG. 13. The circuit 400 includes the memory device 200 shown in FIG. 11, a processor 401 and an interface 402 and is formed as a single semiconductor chip. The memory device 200 shown in FIG. 11 is used as a program ROM to store a program necessary for the operation of the processor 401. The processor 401 operates according to the program stored in the memory device 200 to control the memory device 200 and the interface 402. The interface 402 sequentially outputs to the memory device 200 a program supplied from an external device.

<Operation>

Next, the operation of the semiconductor integrated circuit (reconfigurable LSI) 400 shown in FIG. 13 is described. The operation of the circuit 400 includes a program execution process wherein the circuit 400 operates according to a stored program and a program rewrite process for rewriting the program stored in the memory device 200 to another new program.

[Program Execution Process]

In the first place, the program execution process is described.

To read a program stored in the memory device 200, the processor 401 outputs a mode selection signal MODE which indicates "reproduction mode" to the control section 203 of the memory device 200.

Then, the processor 401 sequentially outputs to the address buffer 202 of the memory device 200 address signals ADDRESS indicative of memory cells in which the required program is stored. As a result, in the memory device 200, memory cells are sequentially selected according to address signals ADDRESS.

Then, in the memory device 200, the same operation as that of the reproduction mode of embodiment 2 is performed. As a result, the program stored in the memory device 200 is read on a bit-by-bit basis as output data Dout.

Then, the processor 401 performs a predetermined operation according to the program read from the memory device 200.

[Program Rewrite Process]

Next, the program rewrite process is described.

To erase a program stored in the memory device 200 (a program which is to be rewritten), the processor 401 outputs a mode selection signal MODE which indicates "reset mode" to the control section 203 of the memory device 200.

Then, the processor 401 sequentially outputs to the address buffer 202 of the memory device 200 address signals ADDRESS indicative of memory cells storing the program to be rewritten. As a result, in the memory device 200, memory cells are sequentially selected according to address signals ADDRESS.

Then, in the memory device 200, the same operation as that of the reset mode of embodiment 2 is performed. As a result, the program stored in the memory cells is reset on a bit-by-bit basis.

After the completion of the resetting of the memory cells, the processor 401 outputs a mode selection signal MODE which indicates "memorization mode" to the control section 203 of the memory device 200 in order to write a new program.

Then, the processor 401 sequentially outputs to the address buffer 202 of the memory device 200 address signals ADDRESS which indicate the positions of memory cells in which a new program is to be stored. As a result, in the memory device 200, memory cells are sequentially selected according to address signals ADDRESS.

Then, the processor 401 outputs a new program supplied from an external device through the interface 402 to the control section 203 of the memory device 200 on a bit-by-bit basis. In the memory device 200, the same operation as that of the memorization mode of embodiment 2 is performed. As a result, the new program is stored in the memory device 200 on a bit-by-bit basis.

Thus, since the memory device 200 is a rewritable nonvolatile memory, it is possible to rewrite a program stored in the memory device 200. That is, the function realized in the processor 401 can be changed. Further, it is possible that a plurality of programs are stored in the memory device 200, and the function realized in the processor 401 can be changed according to a program read out from the memory device 200.

<Effects>

As described above, different functions can be realized with a single LSI, i.e., a reconfigurable LSI is realized.

EMBODIMENT 5

<Structure>

Figure 14:
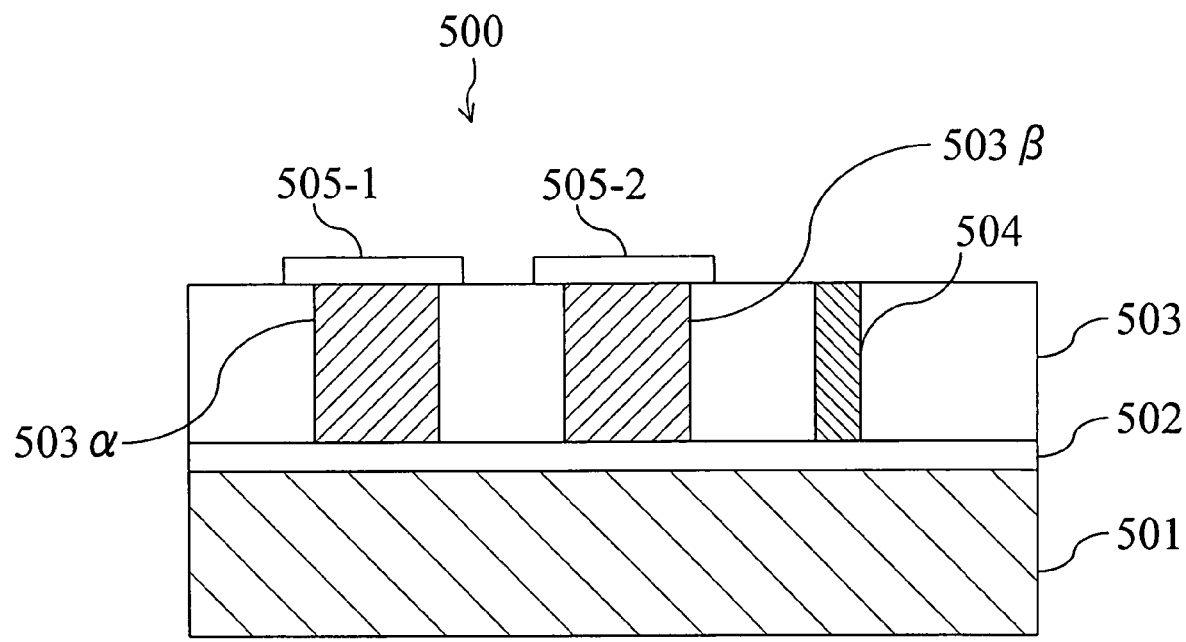
FIG. 14 shows a structure of a memory device according to embodiment 5 of the present invention.

The structure of a memory device 500 according to embodiment 5 of the present invention is shown in FIG. 14. The memory device 500 includes a substrate 501, a lower electrode 502 formed on the substrate 501, a state-variable material layer 503 and a contact plug 504 formed on the lower electrode 502, and upper electrodes 505-1 and 505-2 formed on the state-variable material layer 503. In this example, the lower electrode 502 is formed of Pt (work function: 5.7 eV), the upper electrodes 505-1 and 505-2 are formed of Ag (work function: 4.3 eV), and the state-variable material layer 503 is formed of $CuFe_2O_4$ (thickness: 0.1 μm). The contact plug 504 is formed of Al.

<State-variable Material>

When a predetermined pulse voltage is applied between the upper electrode 505-1 and the lower electrode 502 shown in FIG. 14, the resistance value changes in a region of the state-variable material layer 503 directly below the upper electrode 505-1 (state variable region 503α). When a predetermined pulse voltage is applied between the upper electrode 505-2 and the lower electrode 502 shown in FIG. 14, the resistance value changes in a region of the state-variable material layer 503 directly below the upper electrode 505-2 (state variable region 503β).

When a positive (+) measurement voltage is applied between the upper electrode 505-1 and the lower electrode 502 shown in FIG. 14, an electric current having a current value determined according to the resistance value of the state variable region 503α flows from the contact plug 504. If a negative (−) measurement voltage is applied between the upper electrode 505-1 and the lower electrode 502 shown in FIG. 14, no electric current flows. As well, when a positive (+) measurement voltage is applied between the upper electrode 505-2 and the lower electrode 502 shown in FIG. 14, an electric current having a current value determined according to the resistance value of the state variable region 503β flows from the contact plug 504. If a negative (−) measurement voltage is applied between the upper electrode 505-2 and the lower electrode 502 shown in FIG. 14, no electric current flows.

<Equivalent Circuit>

Figure 15:
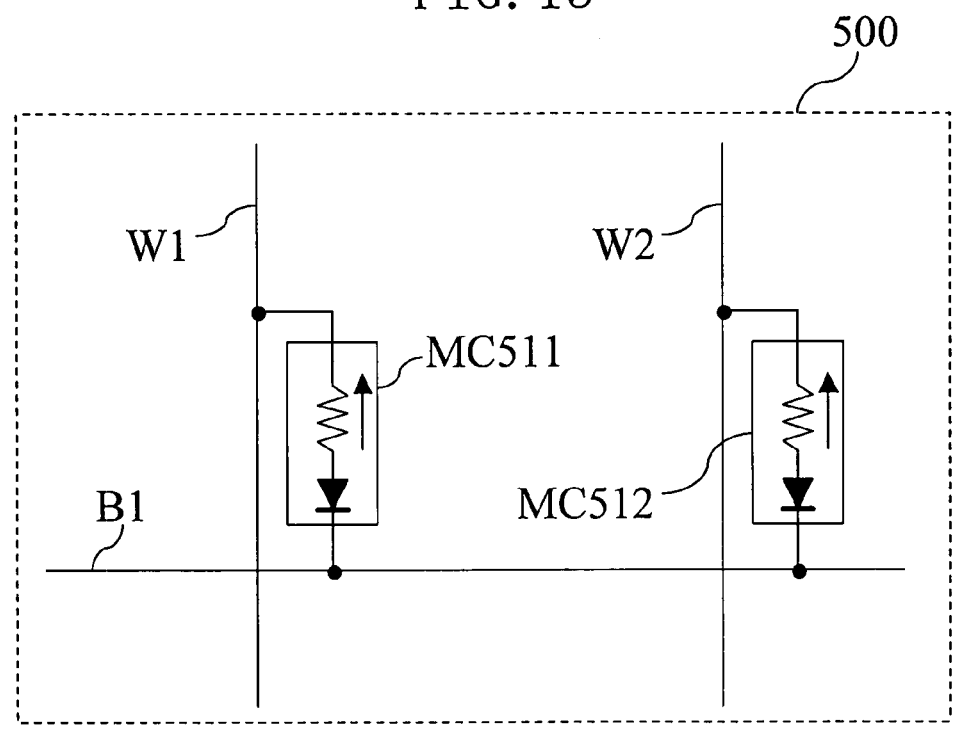
FIG. 15 shows an equivalent circuit of the memory device of FIG. 14.

The equivalent circuit of the memory device 500 of FIG. 14 is shown in FIG. 15. In FIG. 15, a word line W1 corresponds to the upper electrode 505-1, a word line W2 corresponds to the upper electrode 505-2, and the lower electrode 502 and the contact plug 504 correspond to a bit line B1. A memory cell MC511 corresponds to the state variable region 503α, and a memory cell MC512 corresponds to the state variable region 503β.

<Operation>

Then, the operation of the memory device 500 shown in FIG. 14 is described with reference to the equivalent circuit shown in FIG. 15. The operation of the memory device 500 shown in FIG. 14 includes a memorization mode where 1-bit data is memorized in a memory cell, a reset mode where 1-bit data is reset, and a reproduction mode where 1-bit data stored in a memory cell is reproduced.

[Memorization Mode]

In the first place, the bit line B1 (the lower electrode 502 and the contact plug 504) and the word line W2 (the upper electrode 505-2) are pulled down to the ground, and a memorization voltage is applied to the word line W1 (the upper electrode 505-1). The memorization voltage is, for example, a pulse voltage which has a voltage value of +3 V and a pulse width of 50 nsec. As a result, the resistance state of the memory cell MC511 (the state variable region 503α) changes from "high resistance state" to "low resistance state".

[Reset Mode]

The bit line B1 and the word line W2 are pulled down to the ground, and a reset voltage is applied to the word line W1. The reset voltage is, for example, a pulse voltage which has a voltage value of −3 V and a pulse width of 50 nsec. As a result, the resistance state of the memory cell MC511 changes from "low resistance state" to "high resistance state".

[Reproduction Mode]

The bit line B1 and the word line W2 are pulled down to the ground, and a reproduction voltage is applied to the word line W1. The reproduction voltage is, for example, a voltage which has a voltage value of +0.5 V. As a result, an electric current determined according to the resistance state of the memory cell MC511 flows out from the bit line B1. In the meantime, since in the memory cell MC512 the direction extending from the bit line B1 to the word line W2 is "reverse direction", no electric current flows from the bit line B1 to the word line W2 (from the upper electrode 505-1 to the upper electrode 505-2 through the lower electrode 502).

<Effects>

As described above, since the state-variable material has the "diode characteristic", the direction of the electric current can be defined without forming a diode therefor. Further, the state-variable material has the "variable-resistance characteristic" and therefore can be used as, for example, a 1D1R nonvolatile memory. In such a use, it is not necessary to form a diode, and therefore, the production process is simplified, as compared with a conventional 1D1R nonvolatile memory.

Since a diode is not formed, the polarity of a pulse voltage to be applied to the variable-resistance material is not restricted. Therefore, both a pulse voltage of positive (+) polarity and a pulse voltage of negative (−) polarity can be applied to the state-variable material layer. In such a pulse application method (wherein the resistance value is changed according to the polarity of the pulse voltage), the pulse width of a pulse voltage applied is short (50 nsec in embodiment 1) as compared with a conventional pulse application method (wherein the resistance value of the variable-resistance material is changed by adjusting the pulse width of the pulse voltage). That is, the time required for memorization or reset can be shortened.

In the above-described example of embodiment 5, the work functions of the upper electrodes 505-1 and 505-2 are different from that of the lower electrode 502. However, as a matter of course, the same effects can be obtained even if the crystallinity of the state variable region 503 is nonuniform as described in example 2.

Figure 16:
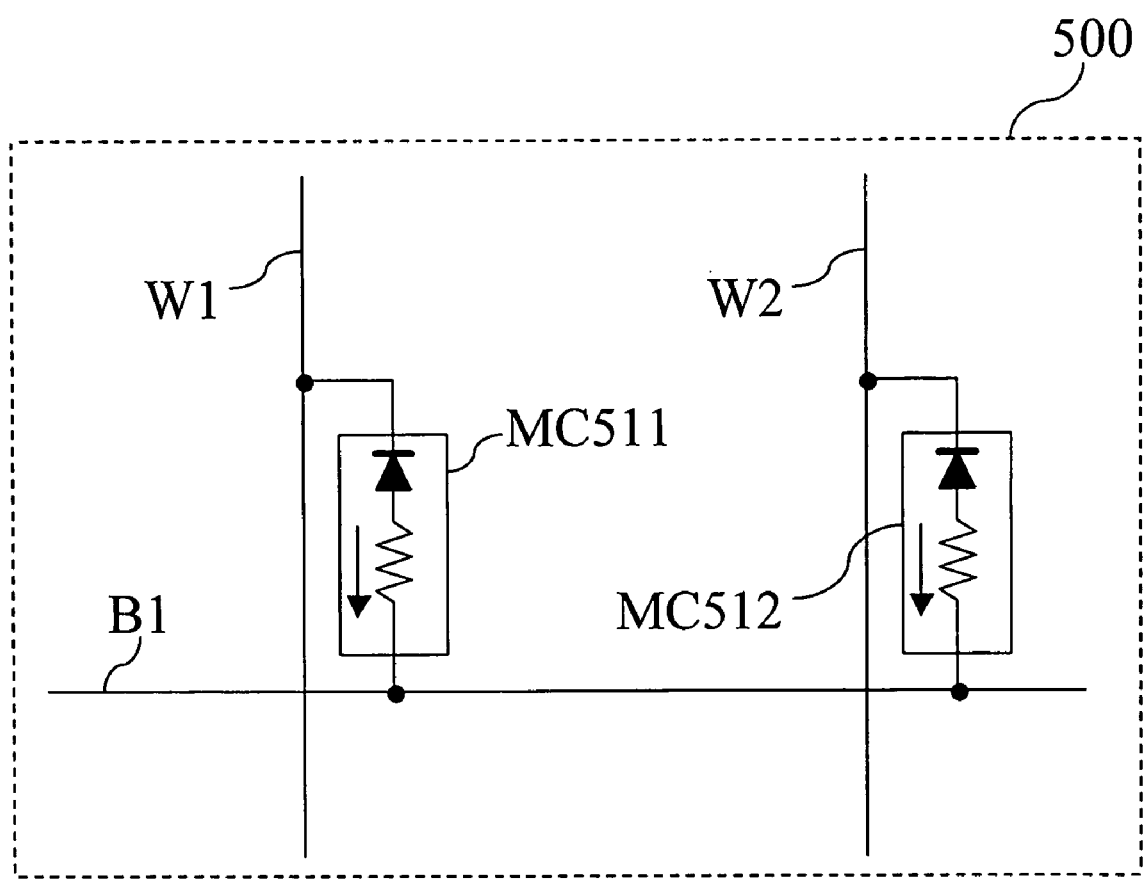
FIG. 16 shows an equivalent circuit of the memory device of FIG. 14.

The state-variable material described in the above example of embodiment 5 has a characteristic such that, when a pulse voltage is applied between the upper electrode 505-1 (505-2) and the lower electrode 502 such that the upper electrode 505-1 (505-2) becomes positive (+) with respect to the lower electrode 502, the resistance state of the state variable region 503α (503β) changes to "low resistance state" and a characteristic such that the direction extending from the upper electrode 505-1 (505-2) to the lower electrode 502 is "forward direction". Meanwhile, we also prepared another state-variable material having a characteristic such that, when a pulse voltage is applied between the upper electrode 505-1 (505-2) and the lower electrode 502 such that the upper electrode 505-1 (505-2) becomes negative (−) with respect to the lower electrode 502, the resistance state of the state variable region 503α (503β) changes to "low resistance state" and a characteristic such that the direction extending from the upper electrode 505-1 (505-2) to the lower electrode 502 is "reverse direction" (for example, sample (A') in example 1). In the case where the state variable region 503 exhibits such a characteristic, the equivalent circuit of the memory device 500 of FIG. 14 is as shown in FIG. 16. Further, in this case, the same effects can be obtained by application of the following voltages. In the memorization mode, a memorization voltage which has a voltage value of −3 V and a pulse width of 50 nsec is applied to the word line W1. In the reset mode, a reset voltage which has a voltage value of +3 V and a pulse width of 50 nsec is applied to the word line W1. In the reproduction mode, a reproduction voltage which has a voltage value of −0.5 V is applied to the word line W1.

The above-described example of embodiment 5 has two upper electrodes, but the present invention is not limited thereto. The same effects can be achieved even when three or more upper electrodes are formed.

EMBODIMENT 6

<Structure>

Figure 17:
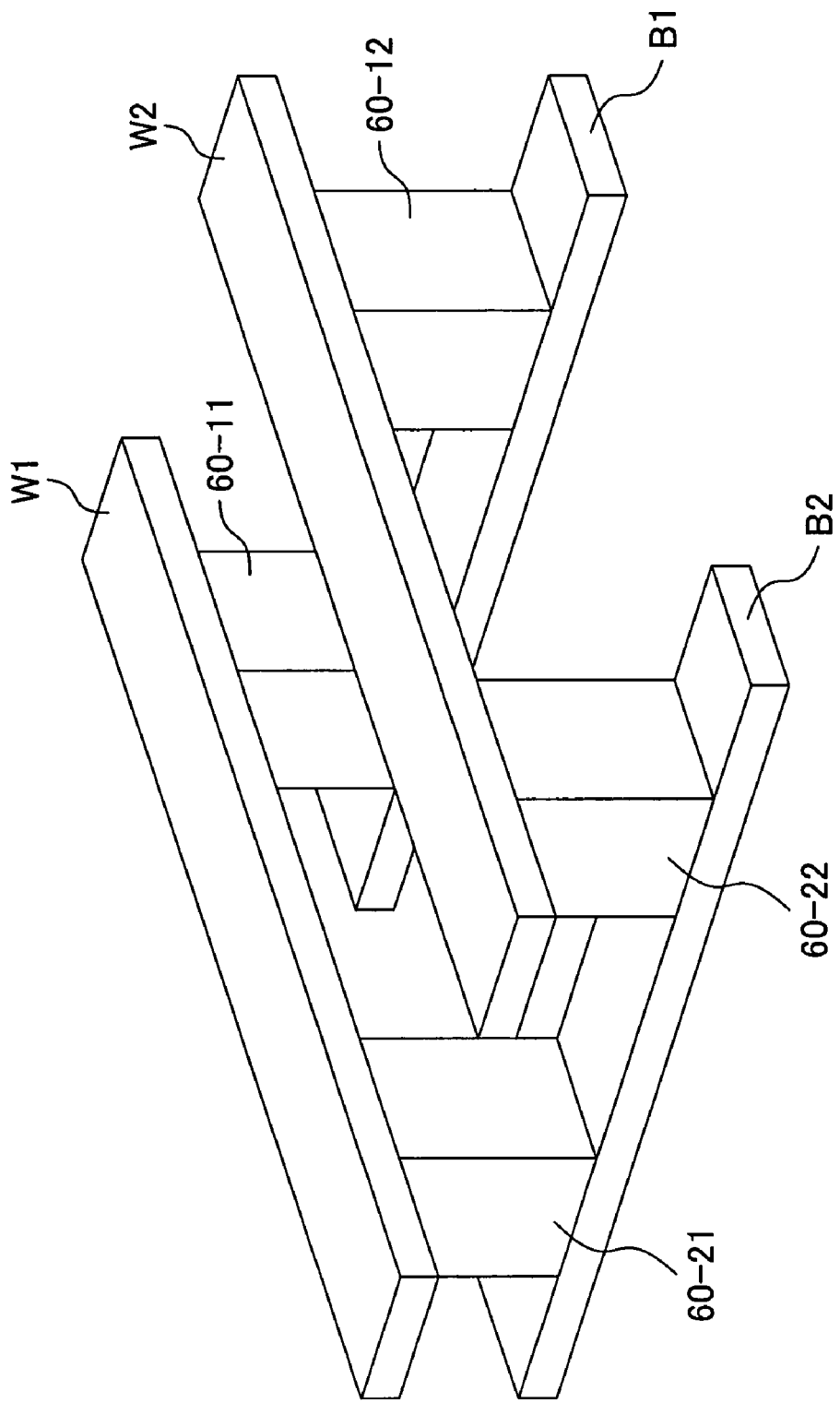
FIG. 17 shows a structure of a memory device according to embodiment 6 of the present invention.

The structure of a memory device according to embodiment 6 of the present invention is shown in FIG. 17. In this device, state-variable portions 60-11, 60-12, 60-21 and 60-22 are provided on bit lines B1 and B2, and word lines W1 and W2 are provided on the state-variable portions 60-11 to 60-22. The bit lines B1 and B2 extend parallel to each other. The word lines W1 and W2 extend parallel to each other. The bit lines B1 and B2 and the word lines W1 and W2 cross each other, and each intersection (cross point) is provided with a state-variable portion. Each of the state-variable portions 60-11 to 60-22 corresponds to the state-variable material layer 2 shown in FIG. 1. Each of the word lines W1 and W2 corresponds to the upper electrode 1 of FIG. 1. Each of the bit lines B1 and B2 corresponds to the lower electrode 3 of FIG. 1. This device utilizes the variation in resistance of each of the state-variable portions 60-11 to 60-22 to memorize and reproduce 1-bit data or multi-bit data.

It should be noted that, in this example, the word lines W1 and W2 are formed of Ag (work function: 4.3 eV), the bit lines B1 and B2 are formed of Pt (work function: 5.7 eV), and the state-variable portions 60-11 to 60-22 are formed of $CuFe_2O_4$ (thickness: 0.1 μm).

<Operation>

Figure 18:
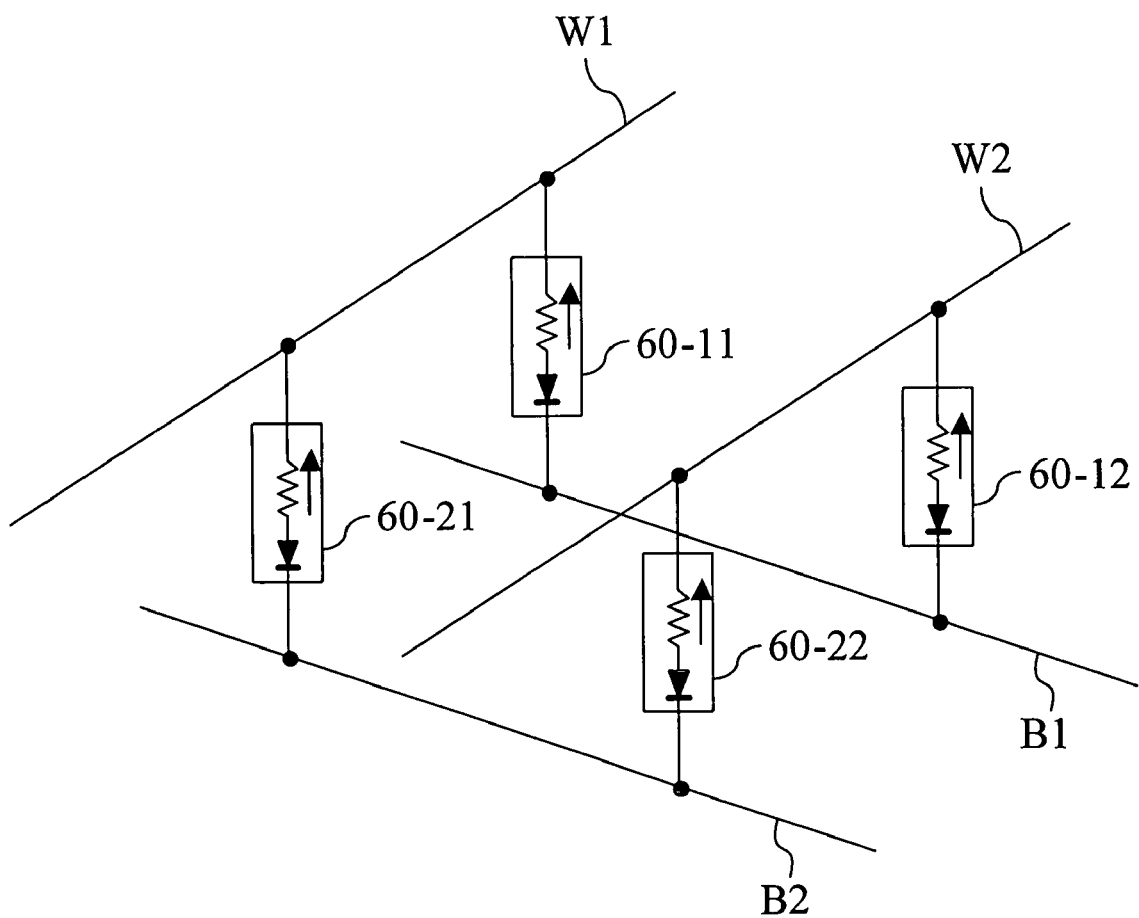
FIG. 18 shows an equivalent circuit of the memory device of FIG. 17.

The operation of the memory device shown in FIG. 17 is now described with reference to the equivalent circuit shown in FIG. 18. In the example illustrated herein, memorization, reset and reproduction performed on the state-variable portion 60-11 are described. It is also assumed that the resistance state of the state-variable portions 60-11 to 60-22 is set to "high resistance state". As they are in embodiment 2, memorization voltage $V1_{WRITE}$ is, for example, a pulse voltage which has a voltage value of +1.5 V and a pulse width of 50 nsec, and memorization voltage $V2_{WRITE}$ is, for example, a pulse voltage which has a voltage value of −1.5 V and a pulse width of 50 nsec. Reproduction voltage $V1_{READ}$ and reproduction voltage $V2_{READ}$ have, for example, a voltage value of +0.5 V. Reset voltage $V1_{RESET}$ is, for example, a pulse voltage which has a voltage value of −1.5 V and a pulse width of 50 nsec. Reset voltage $V2_{RESET}$ is, for example, a pulse voltage which has a voltage value of +1.5 V and a pulse width of 50 nsec.

[Memorization]

In the first place, memorization voltage $V1_{WRITE}$ is applied to the word line W1 connected to the state-variable portion 60-11 which is the process target, while memorization voltage $V2_{WRITE}$ is applied to the bit line B1 connected to the process target state-variable portion 60-11. Meanwhile, the word line W2 and the bit line B2, which are not connected to the state-variable portion 60-11, are pulled down to the ground.

The application of the above voltages means that a positive (+) pulse voltage which has a voltage value of +3 V and a pulse width of 50 nsec is applied to the state-variable portion 60-11. Accordingly, the resistance state of the state-variable portion 60-11 changes to the low resistance state.

In each of the state-variable portions 60-12, 60-21 and 60-22, the resistance state does not change because a pulse voltage sufficient for causing a change in resistance (herein, +3 V) is not applied.

Thus, only the resistance state of the state-variable portion 60-11 changes to the "low resistance state", which means that 1-bit data indicative of "1" is written in the state-variable portion 60-11.

[Reset]

Then, reset voltage $V1_{RESET}$ is applied to the word line W1 connected to the state-variable portion 60-11 which is the process target, while reset voltage $V2_{RESET}$ is applied to the bit line B1 connected to the process target state-variable portion 60-11. Meanwhile, the word line W2 and the bit line B2, which are not connected to the state-variable portion 60-11, are pulled down to the ground.

The application of the above voltages means that a negative (−) pulse voltage which has a voltage value of −3 V and a pulse width of 50 nsec is applied to the state-variable portion 60-11. Accordingly, the resistance state of the state-variable portion 60-11 changes to the high resistance state.

In each of the state-variable portions 60-12, 60-21 and 60-22, the resistance state does not change because a pulse voltage sufficient for causing a change in resistance is not applied.

Thus, only the resistance state of the state-variable portion 60-11 changes to the "high resistance state", which means that 1-bit data memorized in the state-variable portion 60-11 is reset.

[Reproduction Mode]

Then, reproduction voltage $V1_{READ}$ is applied to the word line W1 connected to the state-variable portion 60-11 which is the process target, while reproduction voltage $V2_{READ}$ is applied to the bit line B2 to which the process target state-variable portion 60-11 is not connected. Meanwhile, the word line W2 to which the state-variable portion 60-11 is not connected and the bit line B1 which is connected to the state-variable portion 60-11 are pulled down to the ground.

The application of the above voltages means that a positive (+) measurement voltage is applied to the state-variable portion 60-11. Accordingly, a current which has a current value determined according to the resistance value of the state-variable portion 60-11 flows into the state-variable portion 60-11 and then flows out to the bit line B1.

Since the potential difference between both ends of the state-variable portion 60-12 is 0 V, no current flows through the state-variable portion 60-12. In the state-variable portion 60-12, the direction from the bit line B1 to the word line W2 is "reverse direction", and therefore, a current flowing into the bit line B1 via the state-variable portion 60-11 does not flows into the word line W2.

Since the potential difference between both ends of the state-variable portion 60-21 is 0 V, no current flows through the state-variable portion 60-21.

The above conditions mean that a negative (−) measurement voltage is applied to the state-variable portion 60-22. Therefore, no current flows through the state-variable portion 60-22.

Thus, there is only a current flowing through the state-variable portion 60-11, and the current flows out to the bit line B1, which means that 1-bit data is read from the state-variable portion 60-11.

<Effects>

As described above, the state-variable portions have the "diode characteristic". Thus, even if a cell adjacent to a process target cell has a small resistance value, a superfluous current does not flow through the adjacent cell. Thus, the resistance value of a desired cell can be determined.

The memory device of this embodiment has a single-layer 2-dimensional structure, but the present invention is not limited to the 2-dimensional structure. For example, it may have a 3-dimensional structure. Specifically, in the above example, a single memory device is formed by the layer of bit lines B1 and B2, the layer of the state-variable portions 60-11 to 60-22, and the layer of word lines W1 and W2. Forming an insulating layer over the layer of word lines W1 and W2 enables formation of a new memory device on the insulating layer. Even when an insulating layer is not formed, an elaborate method for applying reproduction voltage, memorization voltage and/or reset voltage enables formation of a new memory device over the word lines W1 and W2. In this case, the production process is easy because the memory device of this embodiment has a simple structure as compared with the memory device having a 3-dimensional structure as disclosed in Japanese PCT National Phase Laid-Open Patent Publication No. 2002-530850. Thus, a larger-capacity memory device can be realized.

Figure 19:
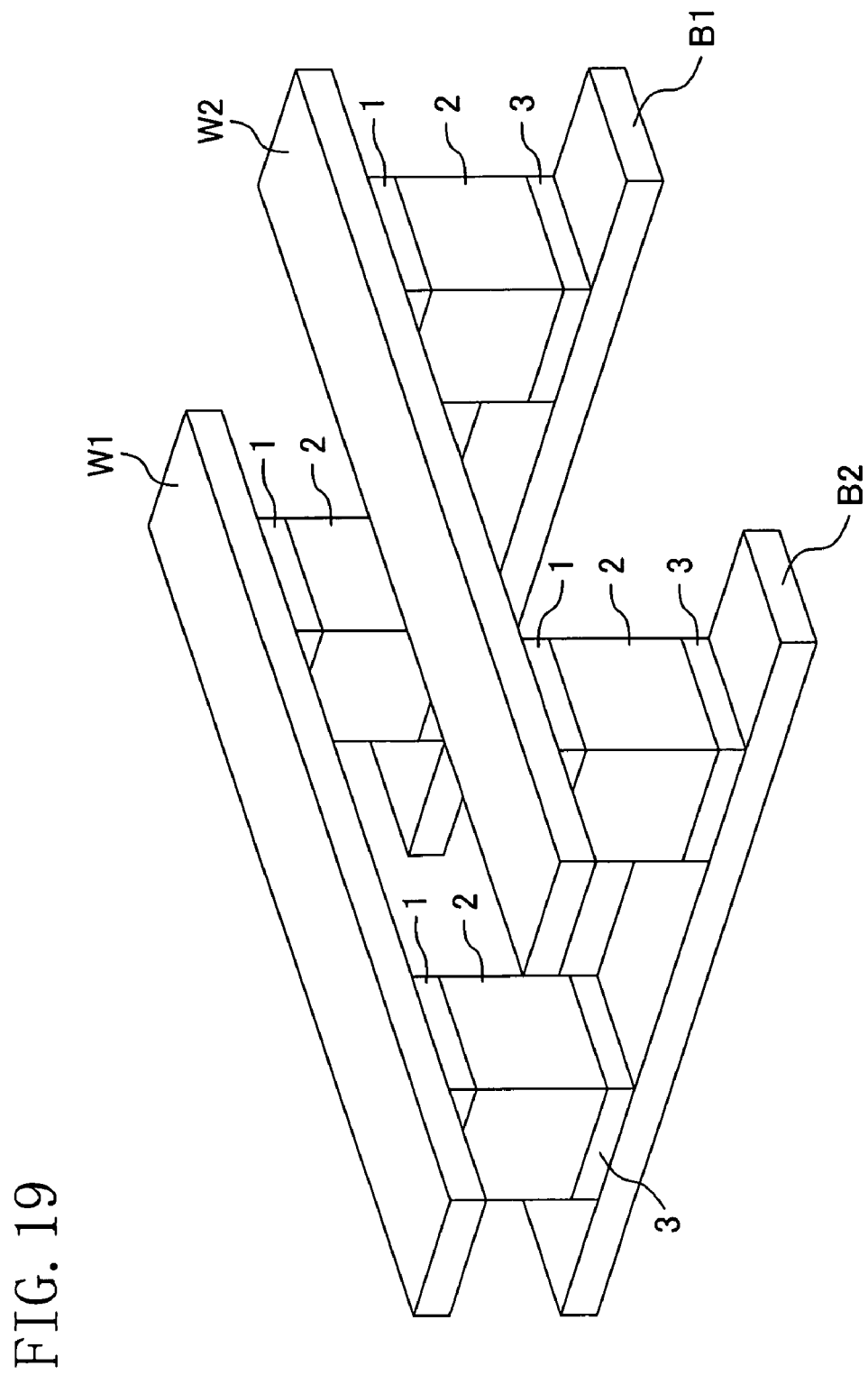
FIG. 19 shows a variation of the memory device according to embodiment 6 of the present invention.

In this embodiment, the state-variable portions are separately provided at respective intersections of the word lines W1 and W2 and the bit lines B1 and B2. However, a memory cell formed by an upper electrode 1, state-variable material layer 2 and lower electrode 3 may be provided at each cross point as shown in FIG. 19. Even with this structure, the same effects are achieved. In this case, for example, the word lines W1 and W2 and the bit lines B1 and B2 are formed of Cu, the upper electrode 1 is formed of Ag, the state-variable material layer 2 is formed of $CuFe_2O_4$, and the lower electrode 3 is formed of Pt.

Figure 20:
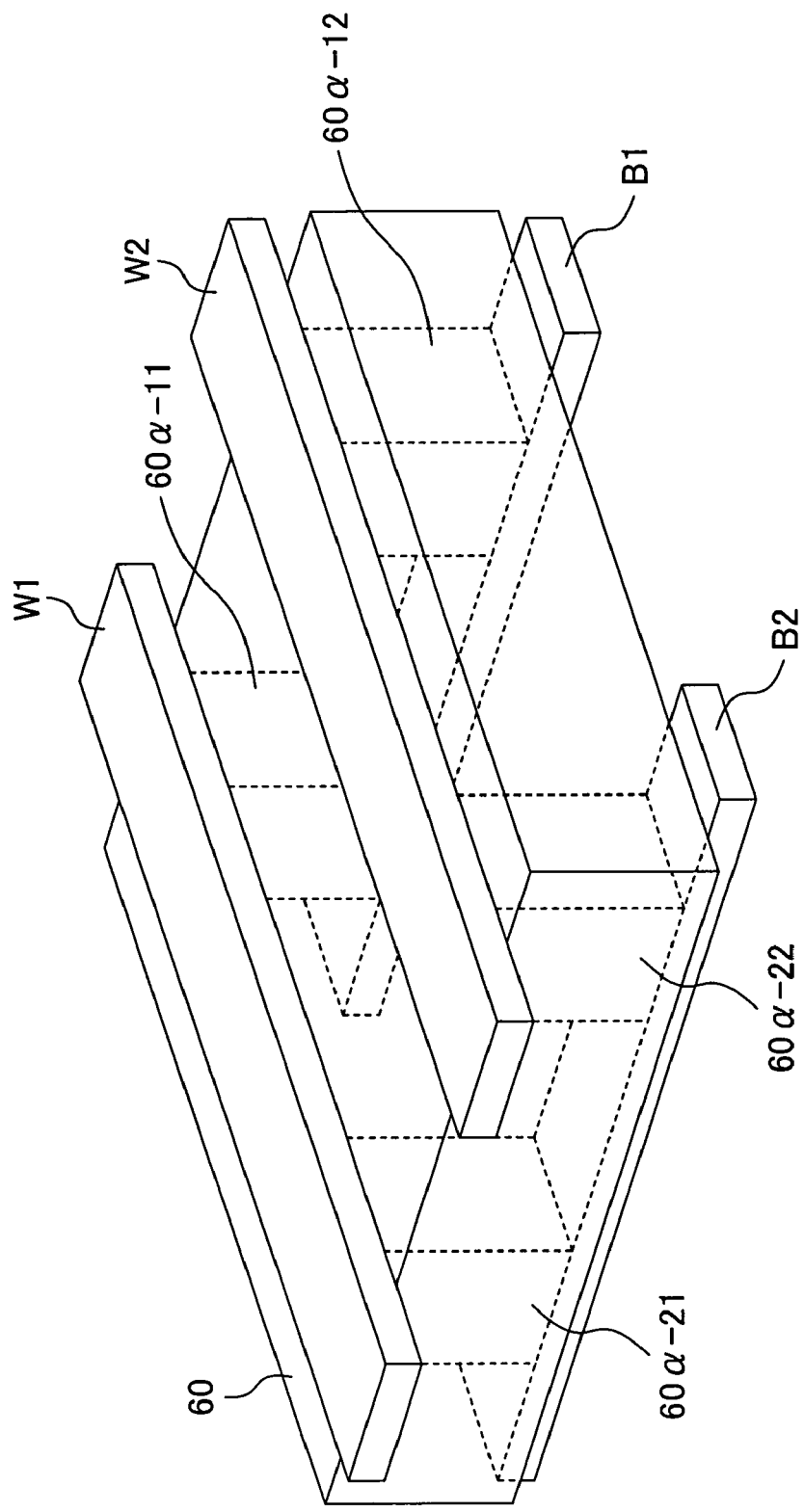
FIG. 20 shows another variation of the memory device according to embodiment 6 of the present invention.

Alternatively, the state-variable material layer 2 may be formed by a single flat film between the word lines W1 and W2 and the bit lines B1 and B2 as shown in FIG. 20. In this case, the regions of the state-variable material layer 2 corresponding to respective cross points, state variable regions 60α-11, 60α-12, 60α-21 and 60α-22, function as memory cells.

As a matter of course, a memory device of this embodiment can be used as the memory array shown in FIG. 11, FIG. 12, or FIG. 13.

In the above descriptions, the resistance state of the electric element can be changed when an applied pulse voltage satisfies predetermined conditions. Thus, in the memorization and reset operations, a pulse voltage which satisfies corresponding conditions is applied to the electric element, and in the reproduction operation, a voltage which does not satisfy the conditions is applied to the electric element, whereby the same effects can be achieved. That is, although in the above-described example the resistance state of the electric element changes from "high resistance state" to "low resistance state" when a voltage having a voltage value of +3 V and a pulse width of 50 nsec is applied, the same effects can be achieved even when the applied pulse voltage has different voltage value and pulse width.

It should be noted that, in the above descriptions of the examples, the normalized value of a resistance change (R/R0) is not necessarily equal to the value shown in the drawings.

INDUSTRIAL APPLICABILITY

An electric element of the present invention is useful as a next-generation nonvolatile memory capable of low-power operation, high-speed writing and erasing, and larger memory capacity, or the like.

The invention claimed is:

1. A memory device, comprising:
a first electrode layer including a plurality of first electrode lines extending parallel to each other;
a state-variable layer lying on the first electrode layer, the state-variable layer including a plurality of state-variable portions, the plurality of state-variable portions being a plurality of state-variable portions formed of a state-variable material which exhibits a diode characteristic and a variable-resistance characteristic; and
a second electrode layer lying on the state-variable layer, the second electrode layer including a plurality of second electrode lines extending parallel to each other,
wherein the plurality of first electrode lines and the plurality of second electrode lines are crossing each other when seen in a layer-stacking direction with the state-variable layer interposed therebetween,
each of the plurality of state-variable portions is provided at an intersection of any one of the plurality of first electrode lines and any one of the plurality of second electrode lines when seen in the layer-stacking direction between the first electrode line and the second electrode line, each state-variable portion exhibiting a diode characteristic such that a forward direction is the direction extending from one of the first electrode line and the second electrode line to the other while a reverse direction is opposite to the forward direction, each state-variable portion exhibiting a variable-resistance characteristic such that a resistance value of the state-variable portion in the forward direction increases/decreases according to a predetermined pulse voltage applied between the first electrode line and the second electrode line.

2. The memory device of claim 1, further comprising a plurality of first electrodes and a plurality of second electrodes, the first and second electrodes corresponding to the plurality of state-variable portions,
wherein each of the plurality of first electrodes intervenes between a state-variable portion corresponding to the first electrode and a first electrode line corresponding to the state-variable portion,
each of the plurality of second electrodes intervenes between a state-variable portion corresponding to the second electrode and a second electrode line corresponding to the state-variable portion, and
each of the plurality of state-variable portions exhibits a diode characteristic such that a forward direction is the direction extending from one of the corresponding first and second electrodes to the other electrode while a reverse direction is opposite to the forward direction, and a variable-resistance characteristic such that a resistance value of the state-variable portion in the forward direction increases/decreases according to a predetermined pulse voltage applied between the first electrode and the second electrode.

3. The memory device of claim 1, wherein the work function of each of the plurality of first electrode lines is different from the work function of each of the plurality of second electrode lines.

4. The memory device of claim 1, wherein the crystallinity of the state-variable material in each of the plurality of state-variable portions is nonuniform.

5. The memory device of claim 1, further comprising:
a first electrode line driver for applying a predetermined voltage to the plurality of first electrode lines; and
a second electrode line driver for applying a predetermined voltage to the plurality of second electrode lines.

6. The memory device of claim 1, wherein the state-variable material is a metal oxide having a spinel structure.

7. The memory device of claim 1, wherein the state-variable material is a ferroelectric oxide containing a metal added thereto.

8. The memory device of claim 1, wherein the state-variable material is a metal oxide having a perovskite structure.

9. The memory device of claim 1, wherein the state-variable material does not contain an alkali metal or alkaline-earth metal.

10. The memory device of claim 2, wherein the work function of each of the plurality of first electrodes is different from the work function of each of the plurality of second electrodes.

11. A memory device, comprising:
a first electrode layer including a plurality of first electrode lines extending parallel to each other;
a state-variable layer lying on the first electrode layer, the state-variable layer being formed of a state-variable material which exhibits a diode characteristic and a variable-resistance characteristic; and a second electrode layer lying on the state-variable layer, the second electrode layer including a plurality of second electrode lines extending parallel to each other, wherein the plurality of first electrode lines and the plurality of second electrode lines are crossing each other when seen in a layer-stacking direction with the state-variable layer interposed therebetween, in the state-variable layer, a state-variable portion which is a variable region interposed between any one of the plurality of first electrode lines and any one of the plurality of second electrode lines exhibits a diode characteristic such that a forward direction is the direction extending from one of the first electrode line and the second electrode line to the other while a reverse direction is opposite to the forward direction and a variable-resistance characteristic such that a resistance value of the state-variable portion in the forward direction increases/decreases according to a predetermined pulse voltage applied between the first electrode line and the second electrode line.

12. The memory device of claim 11, wherein the crystallinity of the state-variable material in the state-variable layer is nonuniform.

13. The memory device of claim 11, wherein the work function of each of the plurality of first electrode lines is different from the work function of each of the plurality of second electrode lines.

14. The memory device of claim 11, further comprising:
a first electrode line driver for applying a predetermined voltage to the plurality of first electrode lines; and
a second electrode line driver for applying a predetermined voltage to the plurality of second electrode lines.

15. The memory device of claim 11, wherein the state-variable material is a metal oxide having a spinel structure.

16. The memory device of claim 11, wherein the state-variable material is a ferroelectric oxide containing a metal added thereto.

17. The memory device of claim 11, wherein the state-variable material is a metal oxide having a perovskite structure.

18. The memory device of claim 11, wherein the state-variable material does not contain an alkali metal or alkaline-earth metal.

19. The memory device of claim 5 wherein, in order to store information in any one of the plurality of state-variable portions,
the first electrode line driver applies a first pulse voltage to one of the plurality of first electrode lines corresponding to the state-variable portion in which the information is to be stored, and
the second electrode line driver applies a second pulse voltage to one of the plurality of second electrode lines corresponding to the state-variable portion in which the information is to be stored.

20. The memory device of claim 5 wherein, in order to reproduce information stored in any one of the plurality of state-variable portions,
the first electrode line driver applies a reproduction voltage to one of the plurality of first electrode lines corresponding to the state-variable portion from which the information is to be read, and
the second electrode line driver applies the reproduction voltage to the plurality of second electrode lines except for one corresponding to the state-variable portion from which the information is to be read.

21. A semiconductor integrated circuit, comprising:
the memory device of claim 5; and
a logic circuit for performing a predetermined operation
wherein the logic circuit has a memorization mode and a processing mode such that the logic circuit in the memorization mode stores bit data in the memory device, and the logic circuit in the processing mode reads bit data stored in the memory device.

22. A semiconductor integrated circuit, comprising:
the memory device of claim 5; and
a processor having a program execution mode and a program rewrite mode,
wherein the processor in the program execution mode operates according to a program stored in the memory device, and the processor in the program rewrite mode replaces a program stored in the memory device with an externally-input new program.

23. The memory device of claim 7, wherein the ferroelectric oxide has an ilmenite structure.

24. The memory device of claim 8, wherein the metal oxide has at least one of a CMR characteristic and high-temperature superconductivity.

25. The memory device of claim 14 wherein, in order to store information in any one of the plurality of state-variable portions,
the first electrode line driver applies a first pulse voltage to one of the plurality of first electrode lines corresponding to the state-variable portion in which the information is to be stored, and
the second electrode line driver applies a second pulse voltage to one of the plurality of second electrode lines corresponding to the state-variable portion in which the information is to be stored.

26. The memory device of claim 14 wherein, in order to reproduce information stored in any one of the plurality of state-variable portions,
the first electrode line driver applies a reproduction voltage to one of the plurality of first electrode lines corresponding to the state-variable portion from which the information is to be read, and
the second electrode line driver applies the reproduction voltage to the plurality of second electrode lines except for one corresponding to the state-variable portion from which the information is to be read.

27. A semiconductor integrated circuit, comprising:
the memory device of claim 14; and
a logic circuit for performing a predetermined operation
wherein the logic circuit has a memorization mode and a processing mode such that the logic circuit in the memorization mode stores bit data in the memory device, and the logic circuit in the processing mode reads bit data stored in the memory device.

28. A semiconductor integrated circuit, comprising:
the memory device of claim 14; and
a processor having a program execution mode and a program rewrite mode,
wherein the processor in the program execution mode operates according to a program stored in the memory device, and the processor in the program rewrite mode replaces a program stored in the memory device with an externally-input new program.

29. The memory device of claim 16, wherein the ferroelectric oxide has an ilmenite structure.

30. The memory device of claim 17, wherein the metal oxide has at least one of a CMR characteristic and high-temperature superconductivity.

* * * * *